(12) United States Patent
Poulsen et al.

(10) Patent No.: US 8,848,932 B2
(45) Date of Patent: Sep. 30, 2014

(54) PROXIMITY SENSING FOR USER DETECTION AND AUTOMATIC VOLUME REGULATION WITH SENSOR INTERRUPTION OVERRIDE

(75) Inventors: Jens Kristian Poulsen, Kitchener (CA); Mohamad El-Hage, Cambridge (CA); Antanas Matthew Broga, Cambridge (CA)

(73) Assignee: BlackBerry Limited, Waterloo, Ontario (CA)

( * ) Notice: Subject to any disclaimer, the term of this patent is extended or adjusted under 35 U.S.C. 154(b) by 425 days.

(21) Appl. No.: 13/272,585

(22) Filed: Oct. 13, 2011

(65) Prior Publication Data

US 2013/0094668 A1    Apr. 18, 2013

(51) Int. Cl.

| | |
|---|---|
| H04R 29/00 | (2006.01) |
| H03G 3/00 | (2006.01) |
| H03G 3/30 | (2006.01) |
| H04R 5/04 | (2006.01) |
| H03G 11/00 | (2006.01) |
| H04R 3/12 | (2006.01) |

(52) U.S. Cl.
CPC ............ *H03G 3/301* (2013.01); H04R 2430/01 (2013.01); H04R 2420/03 (2013.01); *H04R 5/04* (2013.01); H04R 3/12 (2013.01); H04R 2420/01 (2013.01); *H03G 11/002* (2013.01); H04R 2499/11 (2013.01); H04R 2430/03 (2013.01)
USPC ............... 381/58; 381/55; 381/104; 381/107; 381/74

(58) Field of Classification Search
CPC ................................... H04R 1/10; H03G 3/00
USPC ............... 381/74, 104–109, 55, 58
See application file for complete search history.

(56) References Cited

U.S. PATENT DOCUMENTS

| | | | |
|---|---|---|---|
| 5,224,151 | A | 6/1993 | Bowen et al. |
| 5,684,294 | A | 11/1997 | Kouhi |
| 6,639,987 | B2 | 10/2003 | McIntosh |

(Continued)

FOREIGN PATENT DOCUMENTS

| | | |
|---|---|---|
| EP | 0912031 | 4/1999 |
| EP | 1174732 | 1/2002 |
| GB | 2464642 | 4/2010 |

OTHER PUBLICATIONS

European Patent Office, Extended European Search Report and Opinion, For European Patent Application Serial No. 11185117.6. Mailed Apr. 12, 2012.

*Primary Examiner* — Disler Paul
(74) *Attorney, Agent, or Firm* — Bereskin & Parr LLP

(57) ABSTRACT

A mobile device includes at least one speaker and an audio subsystem for providing an audio signal to the at least one speaker for playback by the at least one speaker. The audio subsystem operates by detecting a distance to a user of the mobile device using a proximity sensor and controlling volume output of the at least one speaker based on the distance to the user of the mobile device and the operational status of the proximity sensor. If it is determined that the proximity sensor is functional, the audio subsystem applies a gain factor to the audio signal that varies based on the distance to the user or limits the maximum allowable speaker output based on the distance. A high or low gain setting may be applied for when the user is far away or in close proximity to the mobile device.

16 Claims, 11 Drawing Sheets

(56) References Cited

U.S. PATENT DOCUMENTS

| | | |
|---|---|---|
| 6,853,850 B2 | 2/2005 | Shim et al. |
| 7,196,316 B2 | 3/2007 | Chan et al. |
| 7,522,065 B2 | 4/2009 | Falcon |
| 2006/0093161 A1 | 5/2006 | Falcon |
| 2007/0037605 A1 | 2/2007 | Logan |
| 2010/0058253 A1* | 3/2010 | Son ................ 715/863 |
| 2010/0062812 A1 | 3/2010 | Orr |
| 2010/0167783 A1 | 7/2010 | Alameh et al. |
| 2012/0281850 A1* | 11/2012 | Hyatt ................ 381/74 |

* cited by examiner

PROXIMITY SENSING FOR USER DETECTION AND AUTOMATIC VOLUME REGULATION WITH SENSOR INTERRUPTION OVERRIDE

FIELD

The described embodiments relate to a proximity sensor for performing user detection and automatic volume regulation in a mobile device and, more particularly, to a proximity sensor having an override feature in the event of sensor or circuit interruption.

INTRODUCTION

Many mobile devices equipped for voice communications, such as cellular phones and personal data assistants (PDAs), include a receiver designed to be placed very near to the user's ear for playing back received voice signals. More recently, mobile devices are also being designed with supplemental audio capability, such as playback of stored music or the audio track for a stored video file or a game or other application that has been installed on the mobile device. A second loudspeaker, located separately and spaced apart from the mobile device receiver, may be included in the mobile device for providing the supplemental audio playback. The second loudspeaker may also be used alternatively for providing some of the receiver functions, such as playback of ring tones or as a loudspeaker for the received voice signals, e.g., for handsfree operation of the mobile device.

BRIEF DESCRIPTION OF THE DRAWINGS

For a better understanding of the described embodiments and to show more clearly how they may be carried into effect, reference will now be made, by way of example, to the accompanying drawings in which.

DETAILED DESCRIPTION OF SOME EMBODIMENTS

Figure 1:
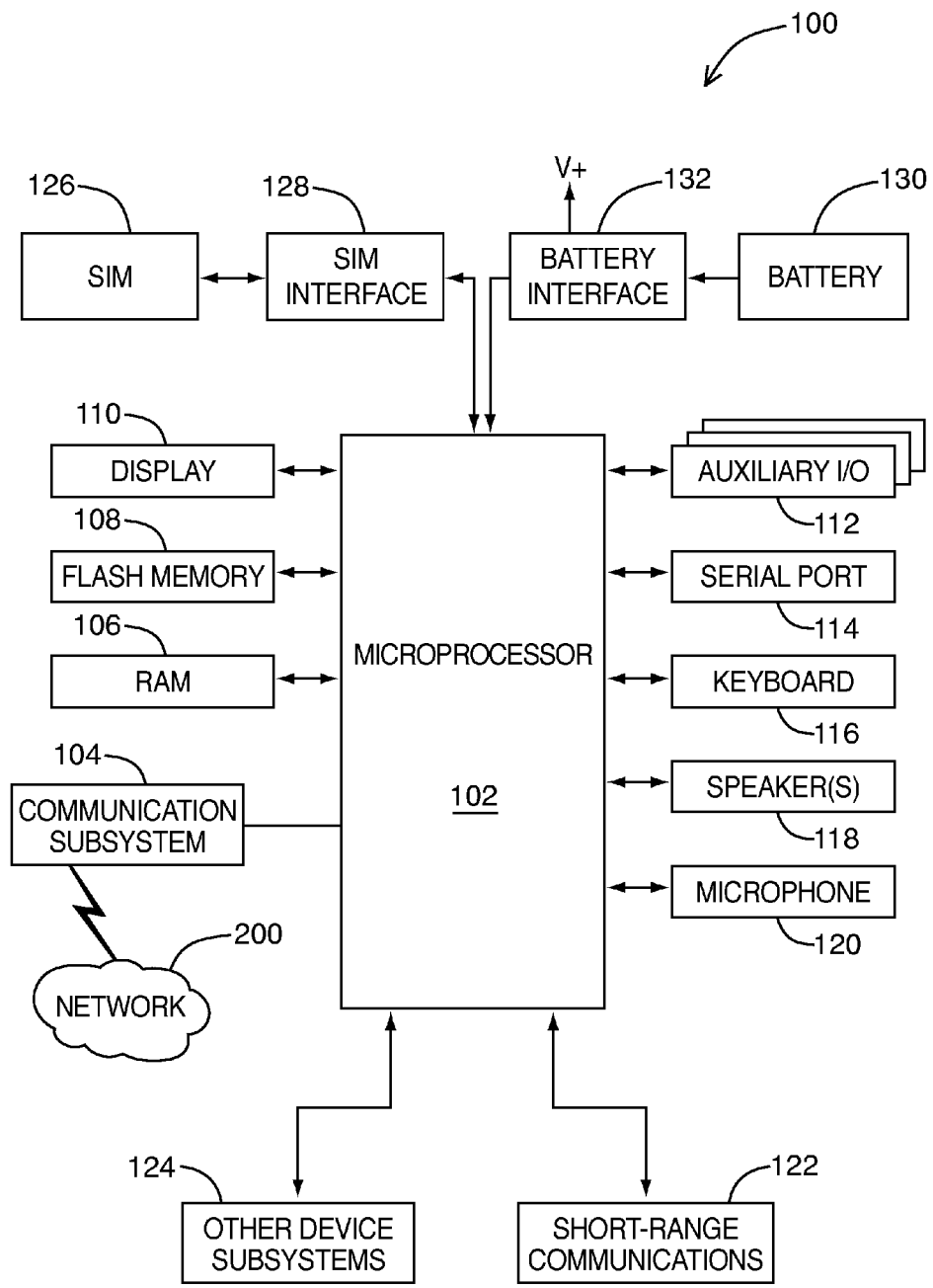
FIG. 1 is a block diagram of a mobile device in one example implementation.

Some regulations and standards for mobile device usage prescribe a maximum acoustic volume that the user of the mobile device should experience. For example, volumes above 110 dBa are not recommended for extended, continuous durations of time, while volumes of around 85 dBa or lower may be considered acceptable. Voice signals emitted from the mobile device receiver will usually not reach the maximum prescribed volumes. However, the mobile device ringers and other auxiliary sound functions, such as music or audio playback, can reach or even exceed the maximum prescribed volumes. As an example, the volume of a mobile device ring tone can reach up to 150 dBA if played back directly into the user's ear. This volume can be both painful or potentially harmful to the ear.

To lessen the chance of excessive volume playback directly into the user's ear, some mobile devices incorporate a loudspeaker in addition to the mobile device receiver. While the receiver is designed to be placed next to the user's ear for providing audio during voice communications, the loudspeaker is housed in the mobile device some distance away from the receiver and generally used for other auxiliary functions, such as playback of ringtones. Should the mobile device happen to ring when the receiver is located next to the user's ear, the sound emitted from the loudspeaker will be somewhat lessened due to the separation between loudspeaker and receiver, which in turn creates some separation between the loudspeaker and the user's ear. While providing a separate loudspeaker may lessen the chance of excessive volume playback directly into the user's ear, as explained more below, inclusion of the loudspeaker may tend to increase the cost and size of the mobile device in comparison to other configurations, which use the same transducer element for both receiver and loudspeaker functions.

In addition to voice and data transmission capabilities, mobile devices have begun to incorporate auxiliary multimedia features, such as audio/video playback and game play. However, the number of loudspeakers included in the mobile device may generally limit the quality of the audio playback that is possible. Assuming that the mobile device receiver is dedicated to audio playback during voice communications, with only a single loudspeaker available to provide auxiliary audio functions, stereophonic (i.e., multiple channel) audio will not generally be possible and the mobile device will therefore be limited to monophonic (i.e., single channel) audio. While ringtones may not generally require stereo sound, stereo playback from stored audio or video files, as well as audio soundtracks from games, may generally enhance user experience of the mobile device. However, stereo ringtones may also generally enhance the user's experience.

Inclusion of a second loudspeaker within the mobile device in addition to the first loudspeaker would permit stereo playback without use of the mobile device receiver, but would also tend to result in a larger and bulkier mobile device. There would also generally be an additional cost associated with the additional electronics and internal components that go into the second loudspeaker. Stereo playback would be made possible without inclusion of the second loudspeaker by converting the mobile device receiver into a second channel for the audio. However, such dual mode use of the same transducer element as both a mobile device receiver and a loudspeaker could result in the volume of sound emanating from the receiver exceeding recommended levels. The term "receiver/speaker" may be used herein to refer to mobile device receivers configured for dual use as a loudspeaker as well. (In general, if an element is said to be "configured for" a function, or "configured to" perform a function, or "adapted to" perform a function, the element is capable of performing that function, in some cases, in addition to other functions the element is capable of performing.)

To reduce the possibility of sound levels in a receiver/speaker exceeding recommended levels, the mobile device may be equipped with a proximity sensor to estimate the distance between user and mobile device. For example, it is possible to sense the human body reliably using a capacitive sensing scheme, so that the presence of the human body may be detected accurately at an approximate distance of 1-10 cm from the mobile device. Capacitive sensing schemes generally operate on the principle that the dielectric constant of air is significantly different than the dielectric constant of human tissue, which is mostly composed of water. Accordingly, it is possible to sense whether the mobile device is located close to the ear (common for voice communication) or if the mobile device is set down on a surface (common for high volume audio playback) and surrounded mostly by air. The playback volume of the receiver/speaker may then be controlled based on (i.e., responsive to or as a function of) the distance between mobile device and user. With reliable proximity detection, the functions of the mobile device receiver may be combined with the functions of a loudspeaker into a single audio unit driven by a common amplification stage. Optionally, inclusion of a separate loudspeaker would then also enable stereo playback, although mono playback would still be possible using the receiver/speaker if the separate loudspeaker is not included in the mobile device. Other ways of detecting proximity, such as optical and acoustic schemes or other proximity sensor types may also be possible.

While proximity detection using a capacitive sensing scheme is generally very reliable, it is still possible that intermittent sensor interruption or other types of sensor inoperability will be encountered. In some cases, the circuit or unit within the mobile device that performs measurements on the proximity sensor data could also fail. During times in which the proximity sensor is interrupted or otherwise is non-functioning or inoperative, the sensor feedback may incorrectly report the distance between mobile device and user. For example, the proximity sensor may indicate a large distance between user and mobile device when in fact the distance is less than indicated. If the sensor interruption or inoperability is not detected, the volume of sound emitted by the receiver/speaker may again exceed recommended levels, should the playback volume from the receiver/speaker not be limited to reflect the actual distance between mobile device and user. Incorporating a failsafe detector (such as a system including a failsafe generator, as described below) to detect sensor interruption or inoperability may reduce the likelihood of this situation occurring.

In one broad aspect, the described embodiments provide an audio subsystem for a mobile device having at least one speaker. The audio subsystem includes an audio source for generating an audio signal; a proximity sensor including a detection circuit configured to generate a sensor output signal representing a distance to a user of the mobile device, and a failsafe generator coupled to the detection circuit and configured to generate a sensor status signal indicating an operational status of the proximity sensor; and a power amplification module configured to process the audio signal received from the audio source into an amplified audio signal for output by the at least one speaker, the power amplification module including a gain controller responsive to the sensor output signal and the sensor status signal to determine and apply a gain factor to the audio signal based on the distance to the user of the mobile device and the operational status of the proximity sensor.

In some embodiments, the failsafe generator is configured to monitor an operating parameter of at least one internal signal of the proximity sensor, the operating parameter of the at least one internal signal indicative of the operational status of the proximity sensor; and generate the sensor status signal based on the operating parameter of the at least one internal signal.

In some embodiments, the failsafe generator is configured to monitor the operating parameter of the at least one internal signal over a time interval; if over the time interval the operating parameter of the at least one internal signal is within an expected range, set the sensor status signal to a default control value for the gain controller to apply variable gain to the audio signal based on the distance to the user; and if over the time interval the operating parameter of the at least one internal signal is outside the expected range, set the sensor status signal to an override control value for the gain controller to apply fixed gain to the audio signal independently of the distance to the user.

In some embodiments, the proximity sensor further includes a transmitter for generating a transmission signal; a transmitting antenna coupled to the transmitter for radiating the transmission signal outwardly from the mobile device; and a receiving antenna for generating a proximity detection signal having a detection parameter that varies in relation to the transmission signal based on the distance to the user. The detection circuit may be coupled to the receiving antenna to receive the proximity detection signal and configured to generate the sensor output signal based on the detection parameter of the proximity detection signal.

In some embodiments, the transmitter includes a signal generator for generating a frequency signal, and the failsafe generator is configured to generate the sensor status signal by monitoring a first operating parameter of at least one of the frequency signal and the transmission signal.

In some embodiments, the transmitter further includes a signal modulator coupled to the signal generator for modulating the frequency signal to generate a modulated frequency signal, and the failsafe generator is configured to generate the sensor status signal by monitoring a second operating parameter of at least one of the modulated frequency signal and the transmission signal.

In some embodiments, the detection circuit includes a load detector for generating a load detection signal based on the proximity detection signal to represent an effective loading of the user on the transmitting antenna, and the failsafe generator is configured to generate the sensor status signal based on the effective loading of the user on the transmitting antenna.

In some embodiments, the failsafe generator is configured to monitor the operating parameter of the at least one internal signal over a time interval; if over the time interval the operating parameter of the at least one internal signal is within an expected range, set the sensor status signal to a default control value for the gain controller to: (i) apply a first fixed gain to the audio signal, if an output volume of the at least one speaker is less than a maximum volume determined for the distance to the user, and (ii) apply a second fixed gain less than the first fixed gain to the audio signal, if the output volume of the at least one speaker is above the maximum volume determined for the distance to the user; and if over the time interval the operating parameter of the at least one internal signal is outside the expected range, set the sensor status signal to an override control value for the gain controller to apply a third fixed gain to the audio signal independently of the distance to the user.

In some embodiments, the audio subsystem further includes at least one supplemental sensor unit for generating at least one supplemental estimate of the distance to the user, and the failsafe generator is configured to determine the sensor status signal based on the sensor output signal and the at least one supplemental estimate of the distance to the user.

In some embodiments, the failsafe generator is configured to generate the sensor output signal based on a difference between the sensor output signal and the at least one supplemental estimate of the distance to the user.

In some embodiments, if the difference between the sensor output signal and the at least one supplemental estimate of the distance to the user exceeds a maximum difference, the failsafe generator is configured to set the sensor status signal to an override control value for the gain controller to apply fixed gain to the audio signal independently of the distance to the user.

In some embodiments, the proximity sensor further includes an isolation switch for enabling and disabling the proximity sensor based upon an output volume of the at least one speaker in relation to a maximum volume.

In another broad aspect, the described embodiments provide a mobile device having at least one speaker and an audio subsystem for providing an amplified audio signal to the at least one speaker for output by the at least one speaker. The audio subsystem including: an audio source for generating an audio signal; a proximity sensor including a detection circuit configured to generate a sensor output signal representing a distance to a user of the mobile device, and a failsafe generator coupled to the detection circuit and configured to generate a sensor status signal indicating an operational status of the proximity sensor; and a power amplification module configured to process the audio signal received from the audio source into the amplified audio signal for output by the at least one speaker, the power amplification module including a gain controller responsive to the sensor output signal and the sensor status signal to determine and apply a gain factor to the audio signal based on the distance to the user of the mobile device and the operational status of the proximity sensor.

In another broad aspect, the described embodiments provide a method for controlling volume output in at least one speaker of a mobile device. The method includes: a proximity sensor detecting a distance to a user of the mobile device; monitoring an operational status of the proximity sensor; providing an audio signal from an audio source; processing the audio signal into an amplified audio signal by determining and applying a gain factor to the audio signal based on the distance to the user of the mobile device and the operational status of the proximity sensor; and providing the amplified audio signal to the at least one speaker for output by the at least one speaker.

In some embodiments, the method further includes monitoring an operating parameter of at least one internal signal of the proximity sensor, the operating parameter of the at least one internal signal indicative of the operational status of the proximity sensor; and determining the operational status of the proximity sensor based on the operating parameter of the at least one internal signal.

In some embodiments, the method further includes monitoring the operating parameter of the at least one internal signal over a time interval; if over the time interval the operating parameter of the at least one internal signal is within an expected range, applying variable gain to the audio signal based on the distance to the user; and if over the time interval the operating parameter of the at least one internal signal is outside the expected range, applying fixed gain to the audio signal independently of the distance to the user.

In some embodiments, the method further includes the proximity sensor generating a transmission signal; radiating the transmission signal outwardly from the mobile device; and generating a proximity detection signal having a detection parameter that varies in relation to the transmission signal based on the distance to the user. The method further includes detecting the distance to the user based on the detection parameter of the proximity detection signal.

In some embodiments, generating the transmission signal includes generating a frequency signal, and the method further includes monitoring a first operating parameter of at least one of the frequency signal and the transmission signal; and determining the operational status of the proximity sensor based on the first operating parameter.

In some embodiments, generating the transmission signal further includes modulating the frequency signal to generate a modulated frequency signal, and the method further includes monitoring a second operating parameter of at least one of the modulated frequency signal and the transmission signal; and determining the operational status of the proximity sensor based on the second operating parameter.

In some embodiments, the method further includes generating a load detection signal based on the proximity detection signal to represent an effective loading of the user on a transmitting antenna of the proximity sensor; and determining the operational status of the proximity sensor based on the effective loading of the user on the transmitting antenna.

In some embodiments, the method further includes monitoring the operating parameter of the at least one internal signal over a time interval; if over the time interval the operating parameter of the at least one internal signal is within an expected range: (i) applying a first fixed gain to the audio signal, if an output volume of the at least one speaker is less than a maximum volume determined for the distance to the user, and (ii) applying a second fixed gain less than the first fixed gain to the audio signal, if the output volume of the at least one speaker is above the maximum volume determined for the distance to the user; and if over the time interval the operating parameter of the at least one internal signal is outside the expected range, applying a third fixed gain to the audio signal independently of the distance to the user.

In some embodiments, the method further includes generating at least one supplemental estimate of the distance to the user; and determining the operational status of the proximity sensor based on the distance to the user detected by the proximity sensor and the at least one supplemental estimate of the distance to the user.

In some embodiments, the method further includes determining the operational status of the proximity sensor based on a difference between the detected distance to the user and the least one supplemental estimate of the distance to the user.

In some embodiments, the method further includes, if the difference between the distance to the user detected by the proximity sensor and the at least one supplemental estimate of the distance to the user exceeds a maximum difference, applying fixed gain to the audio signal independently of the distance to the user.

In some embodiments, the method further comprises determining if an output volume of the at least one speaker exceeds a maximum volume; enabling the proximity sensor when it is determined that the output volume exceeds the maximum volume; and disabling the proximity sensor when it is determined that the output volume does not exceed the maximum volume.

Figure 2:
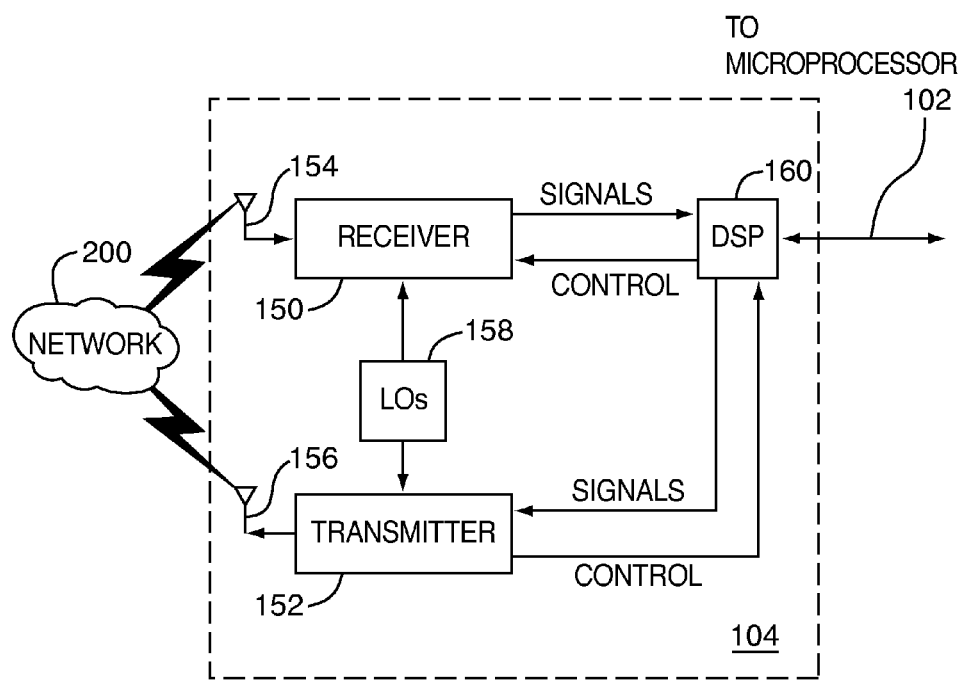
FIG. 2 is a block diagram of a communication sub-system component of the mobile device of FIG. 1.
Figure 3:
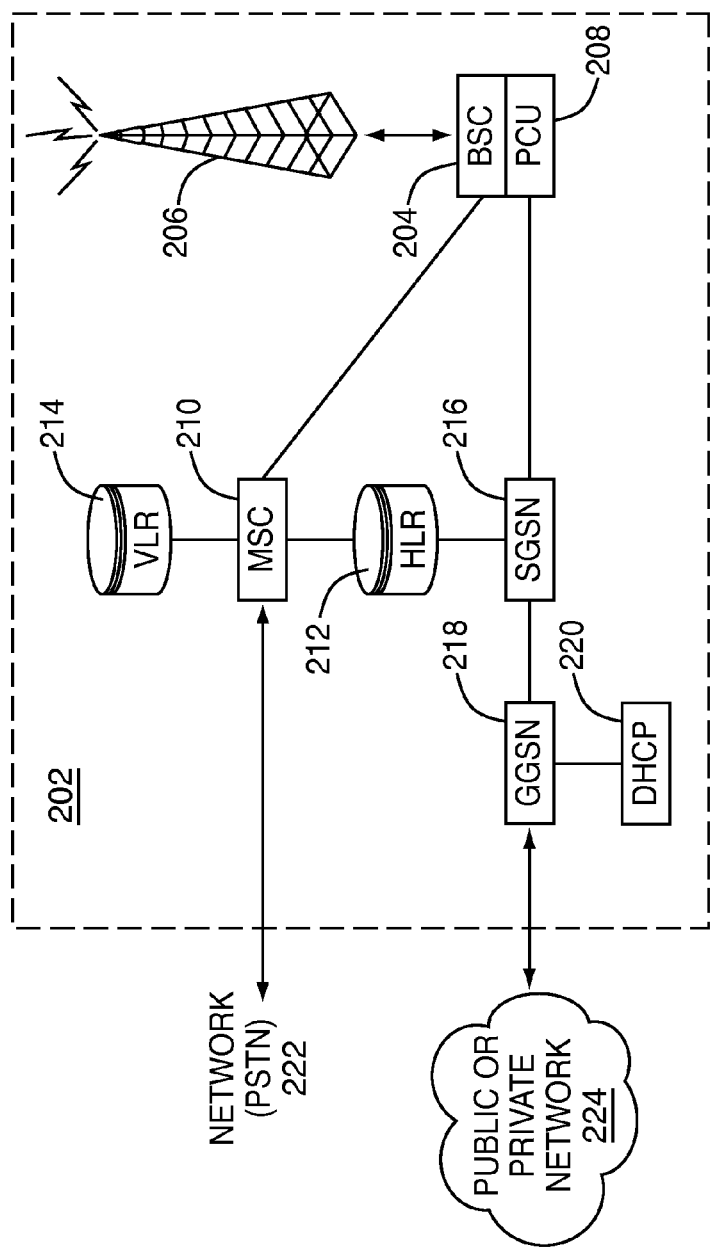
FIG. 3 is a block diagram of a node of a wireless network in one example implementation.

Reference is first made to FIGS. 1 to 3 for a general description of the structure of a mobile device and how the mobile device operates and communicates with other devices. The mobile device (sometimes referred to alternatively as a "mobile station" or "portable electronic device") may be a two-way communication device with advanced data communication capabilities having the capability to communicate with other computer systems and devices. The mobile device may include the capability for voice communications, data communications or a combination of the two. Depending on the functionality provided by a mobile device, it may be referred to as a data messaging device, a two-way pager, a cellular telephone with data messaging capabilities, a wireless Internet appliance, a media player (such as an MP3 player), a portable computer such as a tablet computer or a data communication device (with or without telephony capabilities). The device may be handheld, for example, sized or shaped to be held or carried in a human hand.

Referring now to FIG. 1 specifically, a block diagram of a mobile device 100 in one example implementation is shown generally. Mobile device 100 comprises a number of components, the controlling component being microprocessor 102. Microprocessor 102 controls the overall operation of mobile device 100. In some embodiments, certain communication functions, including data and voice communications, are performed through communication subsystem 104. Communication subsystem 104 receives messages from and sends messages to a wireless network 200.

In this example implementation of mobile device 100, communication subsystem 104 is configured for cellular communication in accordance with the Global System for Mobile Communication (GSM) and General Packet Radio Services (GPRS) standards. The GSM/GPRS wireless network is used worldwide and it is expected that these standards will be superseded eventually by Enhanced Data GSM Environment (EDGE) and Universal Mobile Telecommunications Service (UMTS).

New standards are still being defined, but it is believed that they will have similarities to the network behavior described herein, and it will also be understood by persons skilled in the art that the described embodiments are intended to use any other suitable standards that are developed in the future. The wireless link connecting communication subsystem 104 with network 200 represents one or more different Radio Frequency (RF) channels, operating according to defined protocols specified for GSM/GPRS communications. With newer network protocols, these channels are capable of supporting both circuit switched voice communications and packet switched data communications.

Although the wireless network associated with mobile device 100 is a GSM/GPRS wireless network in one example implementation of mobile device 100, other wireless networks may also be associated with mobile device 100 in variant implementations. Different types of wireless networks that may be employed include, for example, data-centric wireless networks, voice-centric wireless networks, and dual-mode networks that can support both voice and data communications over the same physical base stations. Combined dual-mode networks include, but are not limited to, Code Division Multiple Access (CDMA) or CDMA2000 networks, GSM/GPRS networks (as mentioned above), and third-generation (3G) networks like EDGE and UMTS. Some older examples of data-centric networks include the Mobitex™ Radio Network and the DataTAC™ Radio Network. Examples of older voice-centric data networks include Personal Communication Systems (PCS) networks like GSM and Time Division Multiple Access (TDMA) systems.

Microprocessor 102 also interacts with additional subsystems such as a Random Access Memory (RAM) 106, flash memory 108, display 110, auxiliary input/output (I/O) subsystem 112, serial port 114, keyboard 116, one or more speakers 118, microphone 120, short-range communication subsystem 122 and other device subsystems 124.

Some of the subsystems of mobile device 100 perform communication-related functions, whereas other subsystems may provide "resident" or on-device functions. By way of example, display 110 and keyboard 116 may be used for both communication-related functions, such as entering a text message for transmission over network 200, and device-resident functions such as a calculator, media player or task list. Operating system software used by microprocessor 102 is typically stored in a persistent store such as flash memory 108, which may alternatively be a read-only memory (ROM) or similar storage element (not shown). Those skilled in the art will appreciate that the operating system, specific device applications, or parts thereof, may be temporarily loaded into a volatile store such as RAM 106.

In some embodiments, mobile device 100 may send and receive communication signals over network 200 after required network registration or activation procedures have been completed. Network access is associated with a subscriber or user of a mobile device 100. To identify a subscriber, mobile device 100 requires a Subscriber Identity Module or "SIM" card 126 to be inserted in a SIM interface 128 in order to communicate with a network. SIM 126 is one type of a conventional "smart card" used to identify a subscriber of mobile device 100 and to personalize the mobile device 100, among other things. Without SIM 126, mobile device 100 is not fully operational for communication with network 200.

By inserting SIM 126 into SIM interface 128, a subscriber can access all subscribed services. Services could include: web browsing and messaging such as e-mail, voice mail, Short Message Service (SMS), media transfers (such as music downloading or streaming), and Multimedia Messaging Services (MMS). More advanced services may include: point of sale, field service and sales force automation. SIM 126 includes a processor and memory for storing information. Once SIM 126 is inserted in SIM interface 128, it is coupled to microprocessor 102. In order to identify the subscriber, SIM 126 contains some user parameters such as an International Mobile Subscriber Identity (IMSI). An advantage of using SIM 126 is that subscribers are not necessarily bound by any single physical mobile device. SIM 126 may store additional subscriber information for a mobile device as well, including datebook (or calendar) information and recent call information. In certain embodiments SIM 126 may be a different type of user identifier and may be integral to mobile device 100 or not present at all.

Mobile device 100 includes a power pack that supplies power to electronic components and that supports portability. The power pack may be of any type, but for clarity it will be assumed that mobile device 100 is a battery-powered device and includes a battery interface 132 for receiving one or more rechargeable batteries 130. Battery interface 132 is coupled to a regulator (not shown), which assists battery 130 in providing power V+ to mobile device 100. Although current technology makes use of a battery, future technologies such as micro fuel cells may provide the power to mobile device 100.

Microprocessor 102, in addition to its operating system functions, enables execution of software applications on mobile device 100. A set of applications that control basic device operations, including data and voice communication applications, will normally be installed in flash memory 108 (or other non-volatile storage) on mobile device 100 during its manufacture.

Additional applications may also be loaded onto mobile device 100 through network 200, auxiliary I/O subsystem 112, serial port 114, short-range communications subsystem 122, or the other device subsystems 124. This flexibility in application installation increases the functionality of mobile device 100 and may provide enhanced on-device functions, communication-related functions, or both. For example, secure communication applications may enable electronic commerce functions and other such financial transactions to be performed using mobile device 100.

Serial port 114 enables a subscriber to set preferences through an external device or software application and extends the capabilities of mobile device 100 by providing for information or software downloads to mobile device 100 other than through a wireless communication network. The alternate download path may, for example, be used to load an encryption key onto mobile device 100 through a direct and thus reliable and trusted connection to provide secure device communication.

Short-range communications subsystem 122 provides for wireless device connections to enable communication between mobile device 100 and different systems or devices, without the use of network 200. For example, subsystem 122 may include an infrared device and associated circuits and components for short-range communication. Examples of short range communication would include standards developed by the Infrared Data Association (IrDA), Bluetooth, and the 802.11 family of standards developed by IEEE.

In use, a received signal such as a text message, an e-mail message, or web page download will be processed by communication subsystem 104 and input to microprocessor 102. Microprocessor 102 will then process the received signal for output to display 110 or alternatively to auxiliary I/O subsystem 112. A subscriber may also compose data items, such as e-mail messages, for example, using keyboard 116 in conjunction with display 110 and possibly auxiliary I/O subsystem 112. Auxiliary I/O subsystem 112 may include devices such as: a touch screen, mouse, infrared fingerprint detector, or a roller wheel with a dynamic button pressing capability. Further, auxiliary I/O subsystem 112 may comprise a two-dimensional navigation (or scrolling) component, such as a track ball, a joystick or a directional pad, each optionally with a dynamic button pressing capability. Keyboard 116 is an alphanumeric keyboard and/or telephone-type keypad. A composed item may be transmitted over network 200 through communication subsystem 104.

For voice communications, the overall operation of mobile device 100 is substantially similar, except that the received signals would be output to the one or more speakers 118, and signals for transmission would be generated by microphone 120. Alternative voice or audio I/O subsystems, such as a voice message recording subsystem, may also be implemented on mobile device 100. Although voice or other audio signal output is accomplished primarily through the one or more speakers 118, display 110 may also be used to provide additional information such as the identity of a calling party, duration of a voice call, or other voice call related information. Microphone 120 can receive a supply of power, in the form of a bias voltage and bias current, from the rechargeable battery 130. Different types and configurations of microphone 120 can be incorporated into the mobile device 100.

Referring now to FIG. 2 specifically, a block diagram of the communication subsystem 104 of FIG. 1 is shown. Communication subsystem 104 comprises a receiver 150, a transmitter 152, one or more embedded or internal antenna elements 154, 156, Local Oscillators (LOs) 158, and a processing module such as a Digital Signal Processor (DSP) 160.

The particular design of communication subsystem 104 is dependent upon the network 200 in which mobile device 100 is intended to operate, thus it should be understood that the design illustrated in FIG. 2 serves only as one example. Signals received by antenna 154 through network 200 are input to receiver 150, which may perform such common receiver functions as signal amplification, frequency down conversion, filtering, channel selection, and analog-to-digital (A/D) conversion. ND conversion of a received signal allows more complex communication functions such as demodulation and decoding to be performed in DSP 160. In a similar manner, signals to be transmitted are processed, including modulation and encoding, by DSP 160. These DSP-processed signals are input to transmitter 152 for digital-to-analog (D/A) conversion, frequency up conversion, filtering, amplification and transmission over network 200 via antenna 156. DSP 160 not only processes communication signals, but also provides for receiver and transmitter control. For example, the gains applied to communication signals in receiver 150 and transmitter 152 may be adaptively controlled through automatic gain control algorithms implemented in DSP 160.

The wireless link between mobile device 100 and a network 200 may contain one or more different channels, typically different RF channels, and associated protocols used between mobile device 100 and network 200. A RF channel is a limited resource that must be conserved, typically due to limits in overall bandwidth and limited battery power of mobile device 100.

When mobile device 100 is fully operational, transmitter 152 is typically keyed or turned on only when it is sending to network 200 and is otherwise turned off to conserve resources. Similarly, receiver 150 is periodically turned off to conserve power until it is needed to receive signals or information (if at all) during designated time periods.

Referring now to FIG. 3 specifically, a block diagram of a node of a wireless network is shown as 202. In practice, network 200 comprises one or more nodes 202. Mobile device 100 communicates with a node 202 within wireless network 200. In the example implementation of FIG. 3, node 202 is configured in accordance with General Packet Radio Service (GPRS) and Global Systems for Mobile (GSM) technologies. Node 202 includes a base station controller (BSC) 204 with an associated tower station 206, a Packet Control Unit (PCU) 208 added for GPRS support in GSM, a Mobile Switching Center (MSC) 210, a Home Location Register (HLR) 212, a Visitor Location Registry (VLR) 214, a Serving GPRS Support Node (SGSN) 216, a Gateway GPRS Support Node (GGSN) 218, and a Dynamic Host Configuration Protocol (DHCP) 220. This list of components is not meant to be an exhaustive list of the components of every node 202 within a GSM/GPRS network, but rather a list of components that are commonly used in communications through network 200.

In a GSM network, MSC 210 is coupled to BSC 204 and to a landline network, such as a Public Switched Telephone Network (PSTN) 222 to satisfy circuit switched requirements. The connection through PCU 208, SGSN 216 and GGSN 218 to the public or private network (Internet) 224 (also referred to herein generally as a shared network infrastructure) represents the data path for GPRS capable mobile devices. In a GSM network extended with GPRS capabilities, BSC 204 also contains a Packet Control Unit (PCU) 208 that connects to SGSN 216 to control segmentation, radio channel allocation and to satisfy packet switched requirements. To track mobile device location and availability for both circuit switched and packet switched management, HLR 212 is shared between MSC 210 and SGSN 216. Access to VLR 214 is controlled by MSC 210.

Station 206 is a fixed transceiver station. Station 206 and BSC 204 together form the fixed transceiver equipment. The fixed transceiver equipment provides wireless network coverage for a particular coverage area commonly referred to as a "cell". The fixed transceiver equipment transmits communication signals to and receives communication signals from mobile devices within its cell via station 206. The fixed transceiver equipment normally performs such functions as modulation and possibly encoding and/or encryption of signals to be transmitted to the mobile device in accordance with particular, usually predetermined, communication protocols and parameters, under control of its controller. The fixed transceiver equipment similarly demodulates and possibly decodes and decrypts, if necessary, any communication signals received from mobile device 100 within its cell. Communication protocols and parameters may vary between different nodes. For example, one node may employ a different modulation scheme and operate at different frequencies than other nodes.

For all mobile devices 100 registered with a specific network, permanent configuration data such as a user profile is stored in HLR 212. HLR 212 also contains location information for each registered mobile device and can be queried to determine the current location of a mobile device. MSC 210 is responsible for a group of location areas and stores the data of the mobile devices currently in its area of responsibility in VLR 214. Further VLR 214 also contains information on mobile devices that are visiting other networks. The information in VLR 214 includes part of the permanent mobile device data transmitted from HLR 212 to VLR 214 for faster access. By moving additional information from a remote HLR 212 node to VLR 214, the amount of traffic between these nodes can be reduced so that voice and data services can be provided with faster response times and at the same time requiring less use of computing resources.

SGSN 216 and GGSN 218 are elements added for GPRS support; namely packet switched data support, within GSM. SGSN 216 and MSC 210 have similar responsibilities within wireless network 200 by keeping track of the location of each mobile device 100. SGSN 216 also performs security functions and access control for data traffic on network 200. GGSN 218 provides internetworking connections with external packet switched networks and connects to one or more SGSN's 216 via an Internet Protocol (IP) backbone network operated within the network 200. During normal operations, a given mobile device 100 must perform a "GPRS Attach" to acquire an IP address and to access data services. This requirement is not present in circuit switched voice channels as Integrated Services Digital Network (ISDN) addresses are used for routing incoming and outgoing calls. Currently, all GPRS capable networks use private, dynamically assigned IP addresses, thus requiring a DHCP server 220 connected to the GGSN 218. There are many mechanisms for dynamic IP assignment, including using a combination of a Remote Authentication Dial-In User Service (RADIUS) server and DHCP server.

Once the GPRS Attach is complete, a logical connection is established from a mobile device 100, through PCU 208, and SGSN 216 to an Access Point Node (APN) within GGSN 218. The APN represents a logical end of an IP tunnel that can either access direct Internet compatible services or private network connections. The APN also represents a security mechanism for network 200, insofar as each mobile device 100 must be assigned to one or more APNs and mobile devices 100 cannot exchange data without first performing a GPRS Attach to an APN that it has been authorized to use. The APN may be considered to be similar to an Internet domain name such as "myconnection.wireless.com".

Once the GPRS Attach is complete, a tunnel is created and all traffic is exchanged within standard IP packets using any protocol that can be supported in IP packets. This includes tunneling methods such as IP over IP as in the case with some IPSecurity (IPsec) connections used with Virtual Private Networks (VPN). These tunnels are also referred to as Packet Data Protocol (PDP) Contexts and there are a limited number of these available in the network 200. To maximize use of the PDP Contexts, network 200 will run an idle timer for each PDP Context to determine if there is a lack of activity. When a mobile device 100 is not using its PDP Context, the PDP Context can be deallocated and the IP address returned to the IP address pool managed by DHCP server 220.

Referring now to FIGS. 4-8 generally, the operation of an audio subsystem for a mobile device is explained in greater detail. For convenience, embodiments of the audio subsystem are described in the context of the mobile device 100 shown in FIG. 1. However, it should be appreciated that the described embodiments may also suitable for use in other types of devices, such as stationary or other mobile audio and/or video playback devices, and accordingly are not limited just to use with the mobile device 100.

Figure 4:
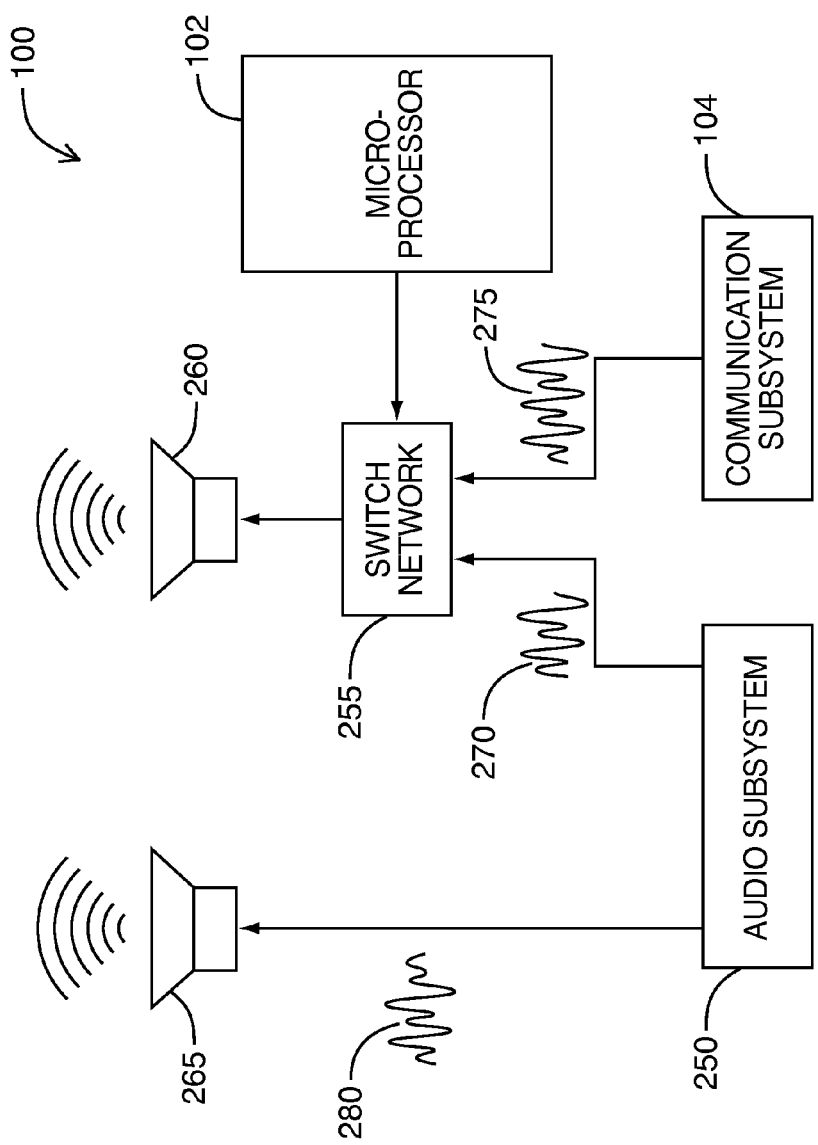
FIG. 4 is a block diagram of a portion of the mobile device shown in FIG. 1.

A portion of the mobile device 100 is illustrated schematically in FIG. 4, including the microprocessor 102, the communication subsystem 104, an audio subsystem 250, a switch network 255, receiver/speaker 260, and auxiliary speaker 265. A general description of the microprocessor 102 and the communication subsystem 104 is provided above with reference to FIGS. 1-3. However, some further details may be specifically noted below to better understand the described embodiments. While not specifically illustrated in FIG. 4, the audio subsystem 250 may be one of the other device subsystems 124 (FIG. 1) included in the mobile device 100. The receiver/speaker 260 and the auxiliary speaker 265 may also each be one of the one or more speakers 118 (FIG. 1).

The audio subsystem 250 generates an amplified audio signal 270, which is provided to the switch network 255 for output by the receiver/speaker 260. The amplified audio signal 270 may represent the output of any auxiliary audio function that is enabled in the mobile device 100. For example, but without limitation, the amplified audio signal 270 may represent a ring tone or other sound used by the mobile device 100 to indicate receipt of incoming data, such as an SMS, MMS or e-mail message. The amplified audio signal 270 may also represent the audio track from music or video files stored on the mobile device 100, the audio track from a game that has been installed on the mobile device 100, or any other audio that the mobile device 100 may generate. The amplified audio signal 270 may also represent any other sound output generated by an application running on the mobile device 100.

In some embodiments, the amplified audio signal 270 may be a monophonic audio signal for playback by a single audio output device of the mobile device 100, e.g., the receiver/speaker 260. Alternatively, if the mobile device is equipped with multiple audio output devices, e.g., the receiver/speaker 260 and the auxiliary speaker 265, the amplified audio signal 270 may represent one channel of a stereophonic audio signal for playback by the multiple audio output devices of the mobile device 100. A second channel of the stereophonic audio signal may be provided in this case by the output from the auxiliary speaker 265. In alternative embodiments, the switch network 255 may be replaced by a multi-channel, variable gain amplifier, where the amplifier gain is adjusted to the source of the amplified audio signal 270 and with regard to a maximum specified sound pressure level.

The communication subsystem 104 generates a voice communication signal 275, which is also provided to the switch network 255 for output by the receiver/speaker 260. The voice communication signal 275 may represent any audio signal generated by the communication subsystem 104 for providing voice communications. For example, the voice communication signal 275 may represent voice signals received by the receiver 154 (FIG. 2) from another mobile device over the network 200 (FIG. 2). Although not specifically shown in FIG. 4, the voice communication signal 275 may alternatively represent voice communications received by the short-range communication subsystem 122 (FIG. 1) from a short-range wireless connection with another mobile device without use of network 200.

The switch network 255 multiplexes the amplified audio signal 270 and the voice communication signal 275 to the receiver/speaker 260 under the control of the microprocessor 102, for example, or some other processor included in the mobile device 100. The microprocessor 102 controls access to the receiver/speaker 260 using the switch network 255 based on a selected mode of operation for the mobile device 100. For example, during voice communication functions, the microprocessor 102 routes the voice communication signal 275 to the receiver/speaker 260, in which case the receiver/speaker 260 operates like a receiver of the mobile device 100. At other times, if the mobile device 100 is switched over to an auxiliary function involving audio playback, the microprocessor 102 routes the amplified audio signal 270 (associated with the auxiliary function) to the receiver/speaker 260. Accordingly, shared use of the receiver/speaker 260 by the audio subsystem 250 and the communication subsystem 104 is enabled through the switch network 255 or other suitable switching device.

In some embodiments, the voice communication signal 275 may be amplified inside the switch network 255 before passing to the receiver/speaker 260. In this case, the switch network 255 may, in addition to multiplexing the amplified audio signal 270 and the voice communication signal 275, function as both an amplifier and regulator of the maximum specified sound pressure level for the receiver/speaker 260.

The auxiliary speaker 265, which may be included in some embodiments of the mobile device 100, is coupled to the audio subsystem 250 to receive and output an amplified auxiliary audio signal 280 generated by the audio subsystem 250. Like the amplified audio signal 270, the amplified auxiliary audio signal 280 may represent the output of any auxiliary audio function that is provided in the mobile device 100, such as a ring tone or other data alert, the audio track from music or video files stored on the mobile device 100, or the audio generated by a game or other application running on the mobile device 100. In some embodiments, the amplified audio signal 270 and the amplified auxiliary audio signal 280 may represent two channels of a stereo output and be provided simultaneously to the receiver/speaker 260 and auxiliary speaker 265 for combined playback.

The auxiliary speaker 265 may be dedicated to playback of the amplified auxiliary audio signal 280 or, alternatively, may be shared by one or more other subsystems of the mobile device 100. For example, the auxiliary speaker 265 may also be coupled to the communication subsystem 104 (or the short-range communications subsystem 122) through a controlled switch network (not shown), similar to the switch network 255, so that the auxiliary speaker 265 may also be capable of outputting voice communication signals. This alternative configuration may be used, for example, to implement a speaker mode on the mobile device 100 for voice communication signals either together with, or independent from, the receiver/speaker 260.

In some embodiments, one or more additional auxiliary speakers (not shown), separate from the auxiliary speaker 265, may also be included and coupled to the audio subsystem 250 to receive and output auxiliary audio signals. For example, the auxiliary speaker 265 and a second auxiliary speaker would together also enable stereo output from the mobile device 100, but without use of the receiver/speaker 260.

Figure 5A:
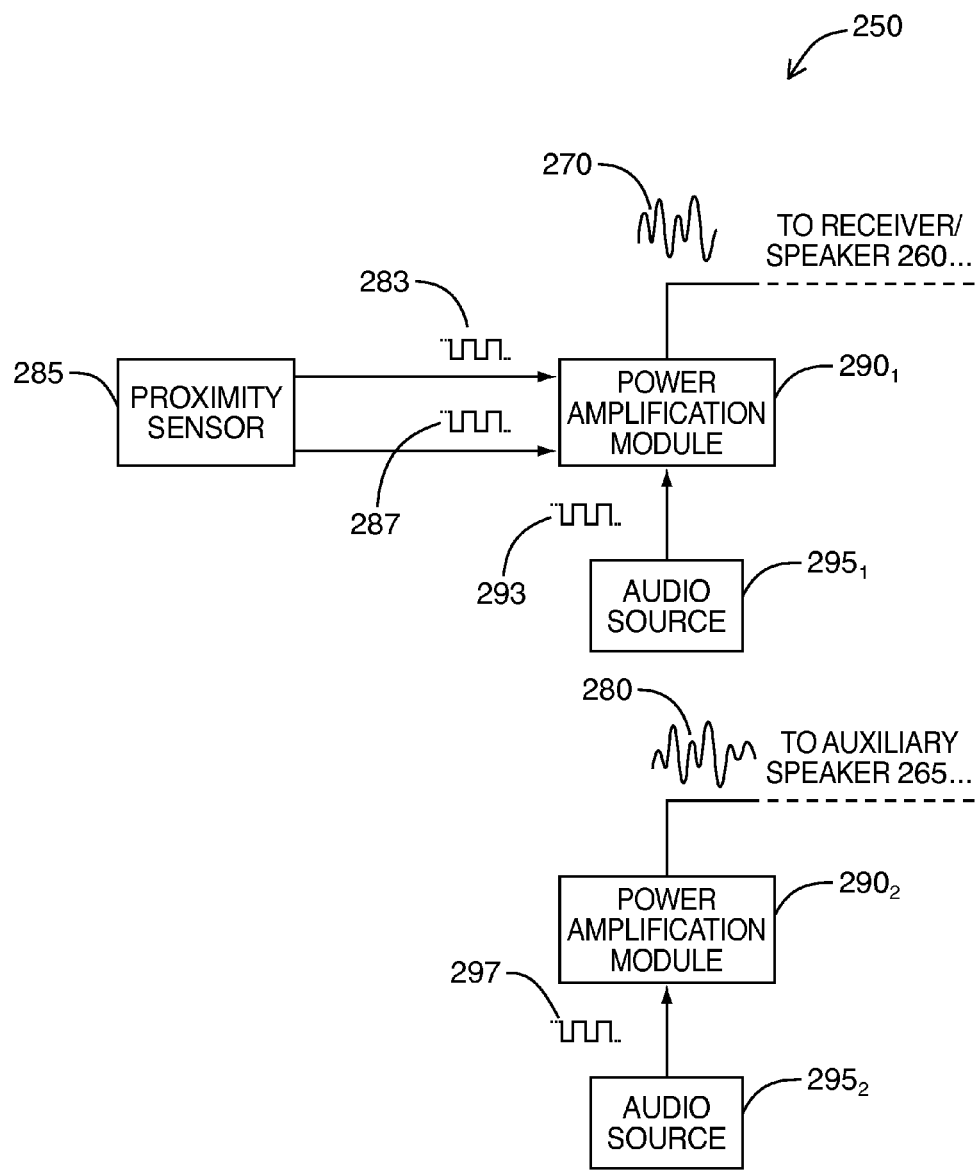
FIG. 5A is a block diagram of an embodiment of a portion of the audio subsystem shown in FIG. 4.

Referring now to FIG. 5A, there is illustrated an example embodiment of a portion of the audio subsystem 250, which may be suitable for use with embodiments of the mobile device 100 that include the auxiliary speaker 265. The audio subsystem 250 comprises a proximity sensor 285, two power amplification modules $290_1$ and $290_2$, and two corresponding audio sources $295_1$ and $295_2$. As will be appreciated, the example embodiment illustrated specifically in FIG. 5A may be modified for use with embodiments of the mobile device 100 that do not include the auxiliary speaker 265 by omitting the second power amplification module $290_2$ and corresponding audio source $295_2$. Similarly, the illustrated example embodiment may be modified for use with embodiments of the mobile device 100 having one or more additional auxiliary speakers by including additional power amplification modules and corresponding audio sources.

The first power amplification module $290_1$ generates the amplified audio signal 270 and is coupled to the proximity sensor 285. In some embodiments, the second power amplifier module $290_1$, which generates the amplified auxiliary audio signal 280, is not coupled to the proximity sensor 285. As used herein, the term "coupled to" includes configurations in which two components are physically coupled, such as by way of a system bus or other connector, as well as electrically coupled, such as by a wireless link or a connection made in a programmable chip or integrated circuit, or both, as context may indicate. The term "coupled to" also includes configurations in which two components are coupled directly together, as well as configurations where the two components are coupled indirectly through one or more intermediate components.

Different types of sensors or detection mechanisms for estimating physical distances, such as between the mobile device 100 and the user of the mobile device 100, may be included in the proximity sensor 285. Different numbers or combinations of sensor types may also be included in the proximity sensor 285. Without limitation, the proximity sensor 285 may include one or more of a capacitive sensor, an infrared sensor (e.g., of a pyroelectric type), a photoelectric or optical sensor, a temperature sensor, an acoustic sensor or an image sensor. In some embodiments, the proximity sensor 285 includes a capacitive sensor either alone or in combination with one or more supplemental sensor units, as will be described in more detail below with reference to FIGS. 6A-6C.

The proximity sensor 285 generates and provides control signals for the power amplification module $290_1$, which operates in response to and based on different control values encoded by the proximity sensor 285 into the control signals. For example, the proximity sensor 285 may specify a particular mode of operation for the power amplification module $290_1$ using the different control signals. Alternatively, the particular mode of operation may be selected by the power amplification module $290_1$ based on the different control values encoded into the control signals. In some cases, one or more operating parameters of the power amplification module $290_1$ may also be encoded into the control signals by the proximity sensor 285.

In some embodiments, the proximity sensor 285 is configured to generate a sensor output signal 283 to represent the estimated distance between the mobile device 100 and the user of the mobile device 100 (which may be referred to herein as the "distance to a user"). The sensor output signal 283 may be a digital or analog signal, and may represent the distance between user and mobile device 100 in different forms or using different quantities, including an estimate of the nominal (i.e., exact or absolute) distance.

To estimate the distance to the user, the proximity sensor 285 may use itself and the nearest detectable body part of the user as reference points for specifying distance. In some cases, the nearest detectable body part may be the user's head, but the nearest detectable body part may also be the user's torso or some other body part, depending on the location or orientation, or both, of the mobile device 100 in relation to the user. Accordingly, the proximity sensor 285 may estimate the distance to the user as the nominal distance between the proximity sensor 285 and the nearest detectable body part of the user, although the proximity sensor 285 may estimate distance differently as context may indicate.

In some embodiments, the sensor output signal 283 may represent the estimated distance to the user in terms of one of more distance ranges as an approximation of the nominal distance to the user. For example, in some embodiments, two distance ranges may be utilized, such as $d_1 < 10$ cm and $d_2 \geq 10$ cm. In alternative embodiments, three or more distance ranges may be utilized, such as $d_1 < 5$ cm, $5$ cm $\leq d_2 < 10$ cm, and $d_3 \geq 10$ cm. These numerical examples are illustrative only. The distance ranges may be specified based on the minimum distance to the user for operation of the mobile device 100 in accordance with applicable regulations or standards for maximum volume output. Additionally, a safety margin may be incorporated into the distance ranges to account for any inaccuracy, approximation or time response characteristics of the proximity sensor 285. In such embodiments, the proximity sensor 285 may again take itself and the nearest detectable body part of the user as reference points in order to specify distance.

In some embodiments, the proximity sensor 285 also generates as output a sensor status signal 287 to indicate an operational status of the proximity sensor 285. For example, one or more internal components of the proximity sensor 285 may become unresponsive or otherwise cease to function during operation of the proximity sensor 285, causing temporary or permanent interruption of the sensor output signal 283. The proximity sensor 285 generates the sensor status signal 287 to indicate that the sensor output signal 283 may not be providing an accurate estimate of distance due to loss of function or operation of the proximity sensor 285. The sensor status signal 287 is provided to the power amplification module $290_1$, together with the sensor output signal 283, for controlling operation of the power amplification module $290_1$ to regulate an overall volume output from the receiver/speaker 260 mobile device 100.

One or more different operational statuses of the proximity sensor 285 may be indicated by encoding an appropriate control value into the sensor status signal 287. Without limitation, the sensor status signal 287 may be encoded with a DEFAULT control value to indicate that the proximity sensor 285 is operational, and an OVERRIDE control value to indicate that the proximity sensor 285 has been interrupted or is otherwise not functioning. As explained further below with reference to FIG. 7, the power amplification module $290_1$ may be controlled differently based upon the control value encoded into the sensor status signal 287. Additional control values, other than the DEFAULT and OVERRIDE control values, may also be encoded into the sensor status signal 287 to indicate additional corresponding operational statuses of the proximity sensor 285.

The different control values may be encoded into the sensor status signal 287 using digital words of sufficient length. In the case of only two operational statuses, the sensor status signal 287 may be a binary signal having only two values (e.g. HIGH and LOW), one for each of the two operational statuses of the proximity sensor 285 (e.g., DEFAULT and OVERRIDE). If more than two operational statuses are defined, a more complex encoding scheme may be implemented in the sensor status signal 287. In some embodiments, the sensor output signal 283 and the sensor status signal 287 may be combined into a single signal to convey information about the proximity sensor 285.

As will be explained in more detail below, the proximity sensor 285 monitors one or more signals generated by the proximity sensor 285 and based upon which the proximity sensor 285 may self-determine its operational status. The monitored signals may include one or more internal signals generated and used within the proximity sensor 285 or, alternatively, may include one or more signals that are outputted by the proximity sensor 285, such as the sensor output signal 283 itself, for use by other elements of the audio subsystem 250 or mobile device 100.

In some alternative embodiments, rather than the proximity sensor 285 self-determining its operational status, a sensor status module (not shown), which is separate from but coupled to the proximity sensor 285, may be implemented and included in the audio subsystem 250 to indicate the operational status of the proximity sensor 285. In either case, the proximity sensor 285 or the separate sensor status module may generate the sensor status signal 287 by monitoring some parameter of the internal or external signals of the proximity sensor 285 that is indicative of its operational status.

As one example, the operational status of the proximity sensor 285 may be determined by monitoring one or more of current consumption, internal node voltages and/or the frequency of internal nodes of the proximity sensor 285. As another non-limiting example, the operational status of the proximity sensor 285 may be indicated by an internal signal with a certain frequency, so that if the monitored signal becomes fixed at a particular logic value, e.g. high or low, it may be determined that the proximity sensor 285 has become non-functional. Different internal and externals signals of the proximity sensor 285 that may be used to indicate operational status are discussed further below.

Power amplification module $290_1$ receives an audio signal 293 originating from audio source $295_1$ and generates the amplified audio signal 270 by processing the audio signal 293 based on the control values encoded into the sensor output signal 283 and sensor status signal 287. Additionally, power amplification module $290_2$ generates the amplified auxiliary audio signal 280 by processing an auxiliary audio signal 297 originating from auxiliary audio source $295_2$. The audio signals 293 and 297 may each be digitally encoded signals or, alternatively, may each be analog signals. Although not shown, in some alternative embodiments, audio signals 293 and 297 may originate from a common audio source, e.g., when the audio signals 293 and 297 are channels of a stereo or other multi-channel output.

As seen from the example embodiment in FIG. 5A, in some cases, power amplification module $290_2$ is not coupled to and controlled by the proximity sensor 285. This may be suitable for embodiments of the mobile device 100 in which the auxiliary speaker 265 is not located in an area of the mobile device 100 that would typically come into close proximity to the user's ear. In this case, the volume output of the auxiliary speaker 265 may be specified by the user irrespective of the estimated distance between the user and the mobile device 100 and, additionally, irrespective of the operational status of proximity sensor 285. On the other hand, since the receiver/ speaker 260 may be designed for operation in close proximity to the user's ear, the power amplification module $290_1$ generates the amplified audio signal 270 based on the estimated distance to the user and operational status of the proximity sensor 285, as encoded into the sensor output signal 283 and the sensor status signal 287, respectively.

With this configuration of the audio subsystem 250, the mobile device 100 is able to generate loud volume output from the auxiliary speaker 265 even if the user is detected near to the mobile device 100. For example, the mobile device 100 may thereby play back ringtones loudly in a wide variety of situations by outputting the ringtones from the auxiliary speaker 265, which is not controlled based on the distance to the user or operational status of the proximity sensor 285. This may be convenient where, for example, the mobile device 100 is inserted into a holster or other article worn or carried by the user, such as a pant pocket. The proximity sensor 285 may then detect the close presence of the user and respond by limiting or reducing power output to the receiver/speaker 260. But by not similarly limiting or reducing the power output of the auxiliary speaker 265, louder sound functions, such as ringtones, would still be available to the user. Given the comparably louder output, the auxiliary speaker 265 may then be located on the mobile device 100 spaced apart from the receiver/speaker 260 in order to lessen the chance of the auxiliary speaker 265 coming into close proximity to the user's ear during times of loud volume output from the auxiliary speaker 265.

Figure 5B:
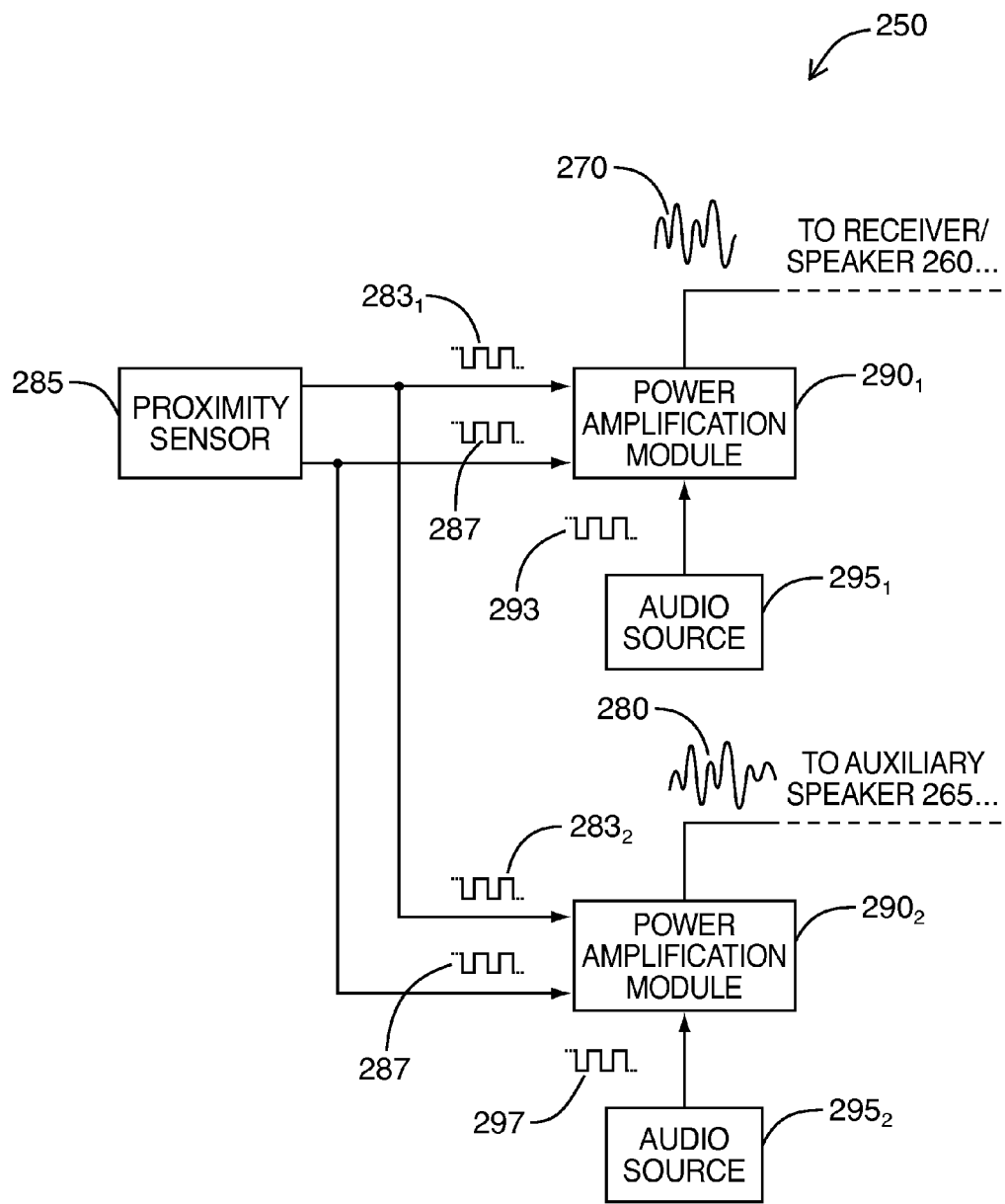
FIG. 5B is a block diagram of an alternative embodiment of the portion of the audio subsystem shown in FIG. 4.

Referring now to FIG. 5B, there is illustrated an alternative embodiment of the audio subsystem 250, in which the proximity sensor 285 is coupled to and controls each of the power amplification modules $290_1$ and $290_2$ based on the estimated distance to the user of the mobile device 100 and the operational status of the proximity sensor 285. To control the power amplification module $290_1$, the proximity sensor 285 generates and provides a sensor output signal $283_1$ and the sensor status signal 287. To control the power amplification module $290_2$, the proximity sensor 285 generates and provides a sensor output signal $283_2$ and the sensor status signal 287.

In some embodiments, the sensor output signals $283_1$ and $283_2$ may be the same signal, so that the proximity sensor 285 controls each of the power amplification modules $290_1$ and $290_2$ equivalently based on the estimated distance to the user of the mobile device 100 and the operational status of the proximity sensor 285. However, in some embodiments, the sensor output signals $283_1$ and $283_2$ generated by the proximity sensor 285 may differ. For example, the receiver/speaker 260 may have different power requirements or capabilities as compared to the auxiliary speaker 265, in which case it may be possible to control the two power amplification modules $290_1$ and $290_2$ differently according to different parameters or characteristics of the particular audio output device, i.e., the receiver/speaker 260 or the auxiliary speaker 265, being driven.

In some embodiments, the power amplification modules $290_1$ and $290_2$ may also receive information relating to one or both of the temperature of the mobile device 100 (FIG. 1) and the status of the battery 130 (FIG. 1). This additional control information may be used to prevent reset of the mobile device 100. For example, if the battery 300 has little charge left, the temperature of the mobile device 100 is outside of a normal operating range or the transmission power of the mobile device 100 is very high, e.g., due to weak signal conditions, the power amplification modules $290_1$ and $290_2$ may respond by decreasing the output power of the speaker/receiver 260 or auxiliary speaker 265, as needed, to prevent reset of the mobile device 100.

Referring still to FIGS. 5A and 5B, the power amplification module $290_1$ and (in the case of the FIG. 5B embodiment) the power amplification module $290_2$ may be controlled by the proximity sensor 285 in such a way that the amplitude of the overall audio output from the mobile device 100 is adjusted based on the detected proximity to the user. For example, while the proximity sensor 285 is operational and generating accurate information about the distance to the user, as indicated by the DEFAULT control value encoded into the sensor status signal 287, the output volume may be reduced when the proximity sensor 285 detects that the user is close to the mobile device 100 (e.g., when the user is holding the mobile device 100 close to the user's ear during wireless voice communications), and increased when the proximity sensor 285 detects that the user is far from the mobile device 100 (e.g., when the mobile device 100 has been set down on a surface). However, the power amplification modules $290_1$ and $290_2$ are not limited to just this one example amplitude control scheme.

In some embodiments, the power amplification modules $290_1$ and $290_2$ control the amplitude of the amplified audio signal 270 and (in the case of the FIG. 5B embodiment) the amplified auxiliary audio signal 280 proportionately to the detected distance of the user. For example, the proximity sensor 285 encodes the estimated distance to the user in the sensor output signals $283_1$ and $283_2$, which may then be used as a form of automatic gain control (AGC) signal for the power amplification modules $290_1$ and $290_2$. Automatic gain control is one example of variable gain that the power amplification modules $290_1$ and $290_2$ may apply in response to the DEFAULT control value.

Alternatively, the power amplification modules $290_1$ and $290_2$ may use the sensor output signals $283_1$ and $283_2$ as power limit control signals, so that the estimated distance to the user is used to specify a maximum amplitude for the amplified audio signal 270 outputted to the user and, optionally, the amplified auxiliary audio signal 280. In such cases, the power amplification modules $290_1$ and $290_2$ would only limit the amplitude of the amplified audio signal 270 and the amplified auxiliary audio signal 280, relative to the amplitude requested by the user, if the user of the mobile device 100 requests a volume that exceeds a specified maximum amplitude (e.g., a maximum volume prescribed in accordance with the regulations or standards for mobile device usage) or if the instantaneous volume of the audio output from the mobile device 100 received by the user exceeds a certain limit. Accordingly, the power amplification modules $290_1$ or $290_2$ may impose different power limits based on the requested volume output in relation to the specified maximum volume. Fixed gain factors may be applied in response to the DEFAULT control value to perform power limiting.

As noted above, for performing the above-described amplitude control, the proximity sensor 285 may encode the estimated distance to the user as a continuous or discrete variable, i.e., by encoding the nominal estimated distance. Alternatively, the proximity sensor 285 may estimate the distance to the user in terms of a particular distance range to the user, and encode the estimated distance range (as opposed to the nominal estimated distance) in the sensor output signals $283_1$ and $283_2$. Other forms or representations of the estimated distance may also be encoded into the sensor output signals $283_1$ and $283_2$.

The sensor status signal 287 is used to enable and, in some cases, override the sensor output signal $283_1$ and (in the case of the FIG. 5B embodiment) the sensor output signal $283_2$, in the event the proximity sensor 285 gets interrupted, becomes unresponsive or otherwise ceases operating. For example, in some embodiments, the power amplification modules $290_1$ and $290_2$ may control the respective amplitudes of the amplified audio signal 270 and the amplified auxiliary audio signal 280 based on the estimated distance to the user, as described above, only so long as the DEFAULT control value is encoded into the sensor status signal 287 to indicate that the proximity sensor 285 is functioning. In such cases, the DEFAULT control value encoded into the sensor status signal 287 may enable the power amplification modules $290_1$ and $290_2$ to perform amplitude control as described herein.

However, if it is detected that the proximity sensor 285 is no longer functioning or is otherwise inoperative, the control value encoded into the sensor status signal 287 may be changed to the OVERRIDE control value to indicate the non-functioning status of the proximity sensor 285. Because the estimated distance to the user may no longer be considered reliable when the proximity sensor 285 is non-functioning, the power amplification modules $290_1$ and $290_2$ respond to the OVERRIDE control value encoded into the sensor status signal 287 and cease to perform an amplitude control scheme that is based on the estimated distance to the user. Overriding the amplitude control under these circumstances reduces the possibility of the mobile device 100 being in close proximity to the user and the volume of sound emitted from the mobile device 100 not simultaneously being reduced in accordance with recommended levels.

In some embodiments, if the sensor status signal 287 is encoded with the OVERRIDE control value to indicate that the proximity sensor 285 is non-functioning, the power management modules $290_1$ and $290_2$ may impose pre-determined power limits on the amplified audio signal 270 and the amplified auxiliary audio signal 280, respectively. Again the power amplification modules $290_1$ and $290_2$ may limit power by applying different gain factors, although the gain factors applied in response to the OVERRIDE control value may be different from any gain factors applied by the power amplification modules $290_1$ and $290_2$ in response to the DEFAULT control value. For example, the pre-determined power limits may correspond to recommended levels for when the user is in close proximity to the mobile device 100. With this example configuration, should the proximity sensor 285 incorrectly indicate that the user is far away when the user is, in fact, in close proximity to the mobile device 100, the OVERRIDE control value encoded into the sensor status signal 287 will prevent the amplified audio signal 270 and the amplified auxiliary audio signal 280 from reaching levels that may potentially be excessive for the user's actual distance. The response time of the proximity sensor 285 and sensor output signals $283_1$ and $283_2$ should both be sufficiently fast to respond to fast movement or re-positioning of the mobile device 100. This way, the user may avoid situations of temporary excessive audio levels.

For example, so long as the volume output from the receiver/speaker 260 remains below a maximum prescribed volume (e.g., a maximum volume prescribed in accordance with the regulations or standards for mobile device usage), the power amplification modules $290_1$ and $290_2$ may disregard the OVERRIDE control value encoded into the sensor status signal 283 perform amplitude control as described herein. This may be accomplished using variable gain to control output volume based on the distance to the user or by applying a fixed gain factor that would be suitable for the relatively low output volumes. However, should the volume output exceed the maximum prescribed volume, then the power amplification modules $290_1$ and $290_2$ may respond to the OVERRIDE control value and perform one of the power limiting functions, as described herein, using one or more potentially different fixed gain factors.

In some embodiments, as an alternative to the above-described power limit control, if the sensor output signal 287 is encoded with the OVERRIDE control value, the power amplification modules $290_1$ and $290_2$ may completely mute the amplified audio signal 270 and the amplified auxiliary audio signal 280. In such cases, only the voice communication signal 275 (FIG. 4), which tends to be quieter than auxiliary sound signals generated by the audio subsystem 250, would be outputted to the receiver/speaker 260. However, it should be appreciated that completely muting the audio signals generated by the audio subsystem 250 when operation of the proximity sensor 285 is interrupted is only one possibility and may not be necessary or desirable in every case.

To reduce power consumption, the proximity sensor 285 may be configured with an isolation switch that may be used to controllably connect and disconnect the proximity sensor 285 from its power supply. For example, the battery 130 (FIG. 1) or some other suitable power pack may supply power to the proximity sensor 285. Using the isolation switch, the proximity sensor 285 may be enabled or disabled based on the requested volume output from the receiver/speaker 260. The isolation switch may be implemented using transistor switches or other switch circuitry.

In some embodiments, if the volume output of the receiver/speaker 260 is below a maximum prescribed volume (e.g., prescribed in accordance with the regulations or standards for mobile device usage), then the proximity sensor 285 may be disabled. Due to the relatively low volume output of the receiver/speaker 260, the possibility of the user experiencing excessive noise levels may be low even without performing proximity detection. However, if the volume output from the receiver/speaker 260 is above the prescribed maximum volume, then the proximity sensor 285 may be enabled and used to control the power amplification modules $290_1$ and $290_2$ for regulating volume output, as described herein. Enabling the proximity sensor 285 for relatively high volume output may tend to reduce the possibility of the user experiencing excessive noise levels.

Having described the general operation of the proximity sensor 285 and the power amplification modules $290_1$ and $290_2$, some specific example implementations will now be described. It should be appreciated that the following specific descriptions are illustrative only and not limiting of the possible configurations for the proximity sensor 285 and the power amplification modules $290_1$ and $290_2$.

Figure 6A:
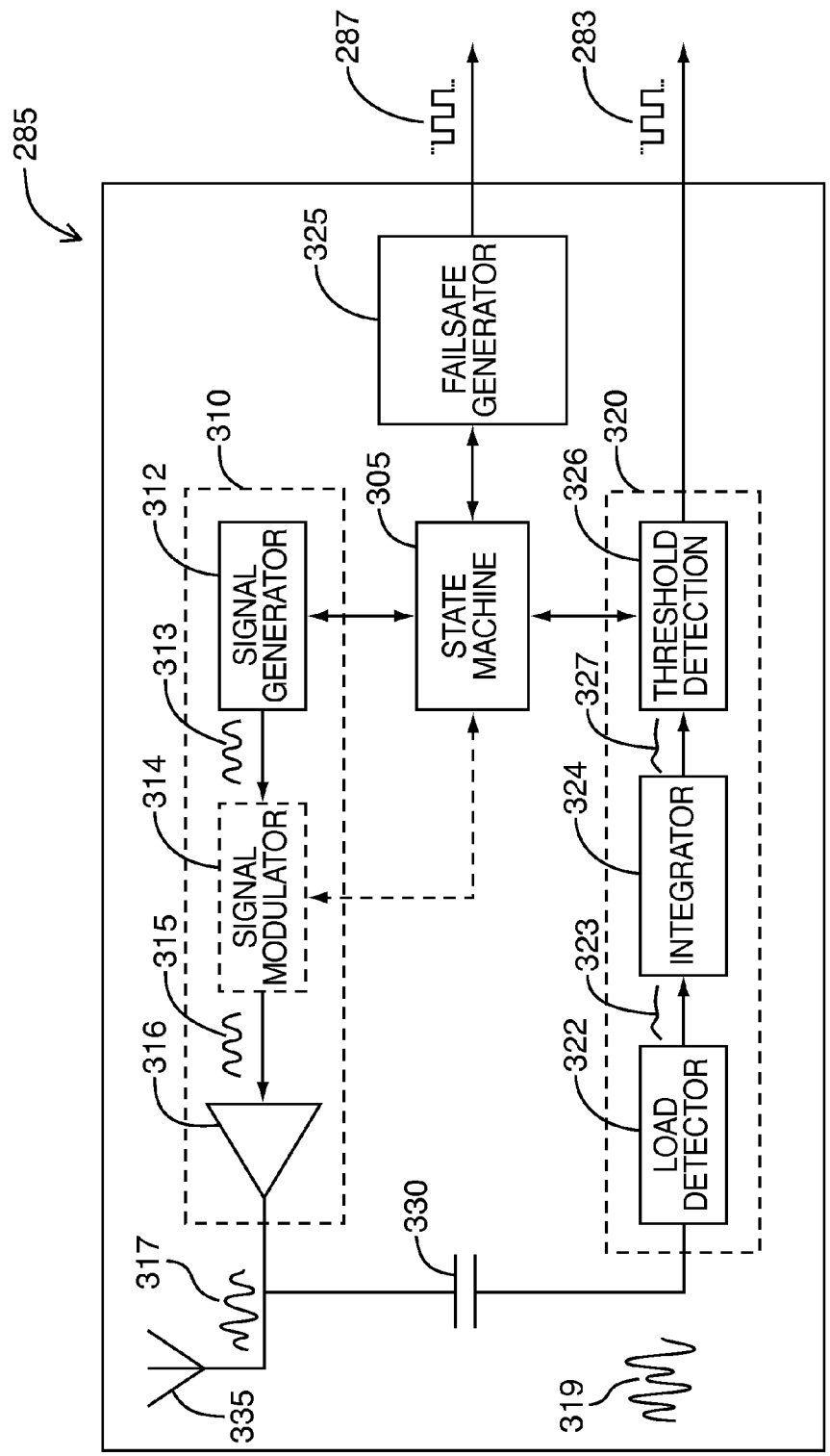
FIG. 6A is a block diagram of an embodiment of the proximity sensor shown in FIGS. 5A and 5B.

Referring now to FIG. 6A, there is illustrated an example embodiment of the proximity sensor 285 that estimates distance to the user of a mobile device using a capacitive sensor. In accordance with the illustrated embodiment, the proximity sensor 285 may include a state machine 305, a transmitter 310, a detection circuit 320, a failsafe generator 325, a coupling capacitor 330 and an antenna 335. In some embodiments, the antenna 335 may be used for both transmitting and receiving detection signals, in which case the coupling capacitor 330 couples the detection circuit 320 to the antenna 335 (also the output of the transmitter 310) and the antenna 335 may be used as both a transmitting antenna and a receiving antenna. A duplexer or circulator may also be included at the antenna 335 to isolate transmitted and received signals. However, in alternative embodiments, a receiving antenna (not shown) separate from the antenna 335 may be included in the proximity sensor 285, either within or coupled to detection circuit 320. In this case, the coupling capacitor 330 may be omitted from the proximity sensor 285 and the antenna 335 may be used as a transmitting antenna, but not as a receiving antenna.

The state machine 305 is connected to each of the transmitter 310, the detection circuit 320 and the failsafe generator 325 for coordinating operation of each component module. In this example configuration, the state machine 305 controls the transmitter 310 to generate a transmission signal 317 that is radiated by the antenna 335 outwardly from the mobile device 100 for capacitively sensing the distance between the mobile device 100 (FIG. 1) and the user. The detection circuit 320 then receives a proximity detection signal 319 and generates the sensor output signal 283 based on a parameter (referred to herein as a "detection parameter") of the proximity detection signal 319, which varies in relation to the transmission signal 317 based on the distance to the user. For example, the detection parameter may be a voltage or current or impedance. Since the dielectric constant of air is substantially different from the dielectric constant of water and tissue, which represents a large constituent of the human body, and further because high frequency electric losses in air and tissue differ, reliable detection of the user may generally be possible. The failsafe generator 325, which is coupled to each of the transmitter 310 and the detection circuit 320, via the state machine 305, generates the sensor status signal 287.

In some embodiments, the transmitter 310 comprises a signal generator 312, an optional signal modulator 314 and an output driver 316. The signal generator 312 may be implemented using an oscillator or other controllable voltage source configured to generate a frequency signal 313, which, for example, may be a radio frequency (RF) signal or other high frequency signal. If the optional signal modulator 314 is omitted from the transmitter 310, the frequency signal 313 may be provided directly to the output driver 316.

Optionally, in some embodiments, the frequency signal 313 is modulated by the signal modulator 314 to generate a modulated frequency signal 315 for the output driver 316. The signal modulator 314 may apply any suitable modulation scheme to the frequency signal 313 to increase the robustness and resilience of the proximity sensor 285 to noise. For example, the signal modulator 314 may apply an amplitude modulation (AM) or frequency modulation (FM), including a random or pseudo-random frequency hopping, to the frequency signal 313. Alternatively, the signal modulator 314 may apply phase shift keying (PSK), including binary or higher order phase shift keying.

The output driver 316 is coupled to the antenna 335, which serves as a load for the transmission signal 317 generated by the output driver 316. As the human body has a very different dielectric constant than air, the presence of the user will disturb the electrical field set up around the antenna 335. Depending on the distance to the user of the mobile device 100, the effective capacitance of the antenna 335 will vary causing different loading of the output driver 316. For example, the capacitance may be anywhere between 1-10 pF depending on the distance to the user, although these numbers are illustrative only. Due to the effective loading of the antenna 335, the transmission signal 317 may be generated having a detection parameter that varies based on the distance to the user.

In some embodiments, a small inductor (not shown) may be included between the output driver 316 and the antenna 335 in order to tune a base capacitive loading of the antenna 335 due predominantly to air in the vicinity of the antenna 335. The base capacitive loading of the antenna 335 may, for example, represent a loading of the antenna 335 that occurs when the user of the mobile device 100 is a sufficient distance away from the antenna 335 so as to not appreciably disturb the surrounding electric field. Inclusion of the inductor may increase the efficiency of the transmitter 310 by shifting the resonant frequency of the antenna 335 to the frequency range of the frequency signal 313 or modulated frequency signal 315 and, further, by providing a good impedance match between the transmitter 310 and the antenna 335. Also, the inductor may be used to form a resonant circuit together with the antenna 335, thereby preserving energy for lower power operation of the transmitter 310.

As the effective loading provided by the antenna 335 varies in relation to the proximity of the user, the detection circuit 320 will also detect a corresponding change in at least one detection parameter of the proximity detection signal 319. In some embodiments, the detection circuit 320 receives the proximity detection signal 319, via the coupling capacitor 330, and processes the proximity detection signal 319 to estimate the distance to the user. The coupling capacitor 330, which may be sized to provide minimal reactance at the frequency range of the proximity detection signal 319, may also be utilized to suppress the dc component, if any, of the proximity detection signal 319. Alternatively, the proximity detection signal 319 may be generated by the receiving antenna within the detection circuit 320.

In order to estimate the proximity of the user of the mobile device 100 based on the proximity detection signal 319, in some embodiments, the detection circuit comprises a load detector 322, an integrator 324, and a threshold comparator (or detector) 326. The load detector 322 calculates the effective capacitive loading of the user on the antenna 335 and generates a load detection signal 323 to represent the effective capacitive loading. The load detection signal 323 may be generated by the load detector 322 based on the proximity detection signal 319. For example, the load detector 322 may be configured to measure the voltage or current magnitude of the proximity detection signal 319, and then compare the measured magnitude against a reference value that would be expected for loading due only to air in the immediate vicinity of the antenna 335. The load detector 322 then determines the effective capacitive loading of the antenna 335 (or the receiving antenna) based on the deviation from expected values, which can be translated into an estimate of the effective distance of the user.

Alternatively, the load detector 322 may measure both the voltage and current waveforms of the proximity detection signal 319 in order to calculate a phase difference between the voltage and current waveforms. The complex impedance of the antenna 335 may then be directly estimated based on the calculated phase difference. Using a measured or pre-determined effective impedance of the antenna 335, the load detector 322 may again determine the effective capacitive loading of the antenna 335 from the calculated complex impedance of the antenna 335, which again may be translated into an estimate of the effective distance to the user.

In some embodiments, a low pass filter having a cutoff frequency above the frequency signal 313 may be included in the load detector 322 to reject noise from the proximity detection signal 319 and stabilize the load detection signal 323. Alternatively, a band pass filter having a pass band around the frequency signal 313 may be used for these or other purposes. In some embodiments, the band pass filter may be used at a receiving path of the load detector 322 and forward to increase noise immunity.

If the optional signal modulator 314 is included in the transmitter 310 to modulate the frequency signal 313, the load detector 322 may also be tuned to and aligned in phase to the modulated frequency signal 315 in order to perform identification of detection signals. For example, in some embodiments, the modulated frequency signal 315 may also be forwarded to the load detector 322 and used for demodulating the proximity detection signal 319 (which will also exhibit signal modulation). Either the modulated frequency signal 315 or the modulation pattern itself may be used to demodulate the proximity detection signal 319. Alternatively, the load detector 322 may detect a phase shift between the modulated frequency signal 315 and the proximity detection signal 319 in order to estimate the distance to the user.

Modulating the frequency signal 313 decreases the likelihood of the load detector 322 mistaking noise or other electromagnetic interference (EMI) at the antenna 335 for the proximity detection signal 319 and thereby generating spurious detection signals. For example, in order to distinguish random noise or other EMI, the load detector 322 may observe the proximity detection signal 319 over a number of modulation periods by comparing it to the modulated frequency signal 315 (used in this context as a reference signal). The probability of the random noise or EMI matching the particular modulation pattern of the modulated frequency signal 315 in each of the modulation periods may be made arbitrarily low. After successfully distinguishing the proximity detection signal 319 from noise or other EMI, the load detector 322 may calculate the load detection signal 323 as described herein. Although not explicitly shown, in some embodiments, a signal demodulator separate from the load detector 322 and coupled to the signal modulator 314 may alternatively be included in the transmitter 310 for demodulating the proximity detection signal 319 prior to generating the load detection signal 323.

The integrator 324 is coupled to the load detector 322 and integrates the load detection signal 323 to calculate an average detection value 327 (which may quantify some value representative of the general significance of the load detection signal 323 over time: the average detection value 327 may be, but need not necessarily be, the arithmetic mean; the average detection value 327 may also be other representative values such as a weighted average or a median or an approximation of the arithmetic mean). The time constant of the integrator 324 is adjustable in different embodiments to stabilize the average detection value 327, but may be on the order of 10 milliseconds. Any suitable configuration of the integrator 324 may be implemented and, in some embodiments, the average detection value 327 may be subjected to further post-filtering.

In some embodiments, the threshold detector 326 compares the average detection value 327 against one or more different threshold values corresponding to difference distance ranges. Based on the outcome of the one or more threshold comparisons, the threshold comparator 326 determines and encodes the sensor output signal 283 with a digital value corresponding to an estimated distance range to the user. If the threshold comparator 326 is configured to estimate the distance to the user in one of two distance ranges, the sensor output signal 283 may be encoded as a binary signal. If three or more distance ranges are defined in the threshold comparator 326, the sensor output signal 283 may be encoded as a multi-level digital signal or using multiple binary coded sensor output signals or transmitted in serial binary format. In either case, the threshold comparator 326 outputs the sensor output signal 283 from the proximity sensor 285.

Alternatively, the threshold comparator 326 may be omitted and the average detection value 327 may be provided directly as the sensor output signal 283. For example, as described above, the average detection value 327 may be roughly proportional to the detected capacitive loading of the antenna 335, which provides a coarse estimate of the nominal distance to the user of the mobile device 100. In some embodiments, an analog-to-digital converter (ADC) may also be included to digitize the average detection value 327 and a post-filter may also be included for noise reduction. In some further alternative embodiments, the average detection value 327 may be translated into the estimate of the nominal distance to the user, for example, using a lookup table or transfer function, and then encoded into the sensor output signal 283.

To generate the sensor status signal 287, the failsafe generator 325 may monitor one or more internal signals of the transmitter 310 and/or detection circuit 320 over an observation time interval. Based on operating parameters of the one or more monitored signals, in comparison to expected values, the failsafe generator 325 makes a determination of whether or not the various component modules of the proximity sensor 285 are functioning or have become inoperative. The sensor status signal 287 may then be encoded accordingly with the appropriate control value to provide an indication of the operational status of the proximity sensor 285.

As one non-limiting example, the failsafe generator 325 may monitor an operating parameter of the frequency signal 313 generated by the signal generator 312 to ensure that the signal generator 312 is operational. Loss of function of the signal generator 312 might be indicated by the frequency signal 313 losing its time-varying waveform and going flat, which can happen when the oscillator used in some embodiments to implement the signal generator 312 is interrupted or becomes desynchronized. Should that happen and loading of the antenna 335 be lightened as a result, the detection circuit 320 may then falsely detect the user far away from the mobile device 100 when, in fact, the user is in very close proximity.

Accordingly, in some embodiments, the failsafe generator 325 may track the frequency or amplitude of the frequency signal 313, or both, and encode the sensor status signal 287 with the appropriate control value based upon whether or not the monitored parameter of the frequency signal 313 remains within an expected range over the observation time interval. In the same way, the failsafe generator 325 may equivalently monitor one or more operating parameters of the transmission signal 317.

If over the observation time interval, the frequency or amplitude of the frequency signal 313 remains within the expected range, the failsafe generator 325 may encode the sensor status signal 287 with the DEFAULT control value so that the volume output of the receiver/speaker 260 or auxiliary speaker 265 is controlled based on the distance to the user. However, if over the time interval, the frequency or amplitude of the frequency signal 313 does not remain within the expected range, the failsafe generator 325 may encode the sensor status signal 287 with the OVERRIDE control value so that the volume output of the receiver/speaker 260 or auxiliary speaker 265 is controlled independently of the distance to the user.

As another example, in some embodiments, the failsafe generator 325 may monitor one or more operating parameters of the modulated frequency signal 315 generated by the optional signal modulator 314 or, alternatively, the transmission signal 317 to ensure that the signal modulator 314 remains functional. If the signal modulator 314 ceases to modulate frequency signal 313 due to interruption or other loss of function, the detection circuit 320 may become less immune to noise and EMI in the proximity detection signal 319. As a precaution against the increased possibility of the detection circuit 320 then falsely detecting noise or EMI as the user, or failing to detect the close proximity of the user due to noise or EMI, if the failsafe generator 325 does not detect some form of signal modulation in the modulated frequency signal 315, the sensor status signal 287 may be encoded with the OVERRIDE control value to indicate the loss of function of the proximity sensor 285.

The failsafe generator 325 may determine if the signal modulator 314 is applying modulation by comparing the modulated frequency signal 315 or the transmission signal 317 with the frequency signal 313. If the modulated frequency signal 315 has substantially the same waveform as the frequency signal 313, the failsafe generator 325 may determine that the signal modulator 314 is not functioning. Alternatively, the failsafe generator 325 may perform frequency or power analysis on the modulated frequency signal 315 or the transmission signal 317 in order to detect additional frequency content due to AM or FM schemes or, alternatively, to detect the loss of output power from the output driver 316. To detect PSK, the failsafe generator 325 may subject the modulated frequency signal 315 or the transmission signal 317 to a phase locked loop (PLL) to detect phase variations. These detection methods are illustrative only and not limiting of the possible detection methods the failsafe generator 325 may apply to determine if the signal modulator 314 and output driver 316 are operational.

In these embodiments, any of the phase, frequency spectrum and power spectrum may be considered to be or to provide an operating parameter of the modulated frequency signal 315 that is monitored by the failsafe generator 325 and compared against expected ranges in order to determine the operational status of the proximity sensor 285. The failsafe generator 325 may again encode either the DEFAULT control value or the OVERRIDE control value into the sensor status signal 287 based upon whether the monitored value remains within its expected range over the observation time interval.

In some embodiments, the failsafe generator 325 may monitor a detection parameter of the load detection signal 323, the average detection value 327 or the sensor output signal 283 itself, via the threshold detector 326, to detect time variations. Even if the user maintains the same approximate distance from the mobile device 100 for an extended period of time, it is unlikely that no time variation at all in these signals would be observed. Small relative movements of the user, as well as noise or EMI in the proximity detection signal 319, should translate into small time variations in the load detection signal 323, which would then subsequently appear in the average detection value 327 or the sensor output signal 283. Absence of such variations could be due to component failure in the detection circuit 320, even if the transmitter 310 remains functional.

However, if the mobile device 100 is resting stationary on a table or other surface for high volume playback, the essentially static environment of the mobile device 100 may thereby result in a more or less static load detection signal 323 and corresponding average detection value 327. In such cases, it may be desirable for the volume of the mobile device 100 to not be decreased because the failsafe generator 325 falsely detects loss of operation of the proximity sensor 285. Therefore, in some embodiments, the failsafe generator 325 may determine the operational status of the proximity sensor 285 by detecting small variations in the load detection signal 323, average detection value 327 or sensor output signal 283 for short to medium distances to the user, but not for longer distances. Alternatively, as a supplemental check of the operational status of analog-to-digital converters, the failsafe generator 325 may measure the output of one or more of the analog-to-digital converters, which typically always show some variation due to thermal noise.

In some embodiments, as a further supplementary check, the failsafe generator 325 may also make a determination as to whether or not the mobile device 100 is presently being held by the user. Because the human hand has a generally finite resistance, which can be in the range of 50 k$\Omega$-2 M$\Omega$, the conductivity between two or more points on the outer surface of the mobile phone 100 may differ, depending on whether or not an alternative conduction path between the two or more points is provided through the user's hand. Thus, the failsafe generator 325 may determine whether the mobile device 100 is being held by measuring conductivity between various points on the surface of the mobile phone 100.

Accordingly, if over an observation time interval, the load detection signal 323, the average detection value 327 or the sensor output signal 283 do not vary by at least a minimum amount or otherwise show relatively little time variation, the failsafe generator 325 may determine that the proximity sensor 285 has become non-functional and encode the sensor status signal 287 with the OVERRIDE control value to indicate this operational status of the proximity sensor 285. (In general, a quantity used in a method may be considered to be predetermined when the quantity is expressly or inferentially determined at any time before the quantity is used in the method.) However, as mentioned, this function of the failsafe generator 325 may only be enabled when the user is within a certain (e.g., short to medium) distance range to the mobile device 100. If the sensor output signal 283 is a digital signal, the failsafe generator 325 may specifically detect whether or not the sensor output signal 283 has become locked at the same digital level, or alternatively a range of levels, for the duration of the observation time interval. If the sensor output signal 283 is an analog signal, the failsafe generator 325 may specifically detect whether or not the sensor output signal 283 has not deviated from an average value by more than a threshold percentage. Other methods for characterizing the degree of variation or of monitoring a detection parameter of the load detection signal 323, the average detection value 327 or the sensor output signal 283 may also be utilized.

In different embodiments, the failsafe generator 325 may monitor any number or combination of operating or detection parameters of the frequency signal 313, the modulated frequency signal 315, the transmission signal 317, the proximity detection signal 319, the average threshold value 327, and the sensor output signal 283 to ascertain the operational status of the proximity sensor 285. Alternatively, or additionally, the failsafe generator 325 may also measure current consumption or voltage at various internal bias points within the proximity sensor 285. In these cases, the failsafe generator 325 may determine that the proximity sensor 285 is non-functional based on discrepancies in any one of the monitored signals or measured values, and may encode the sensor status signal 287 accordingly with the appropriate control value.

Figure 6B:
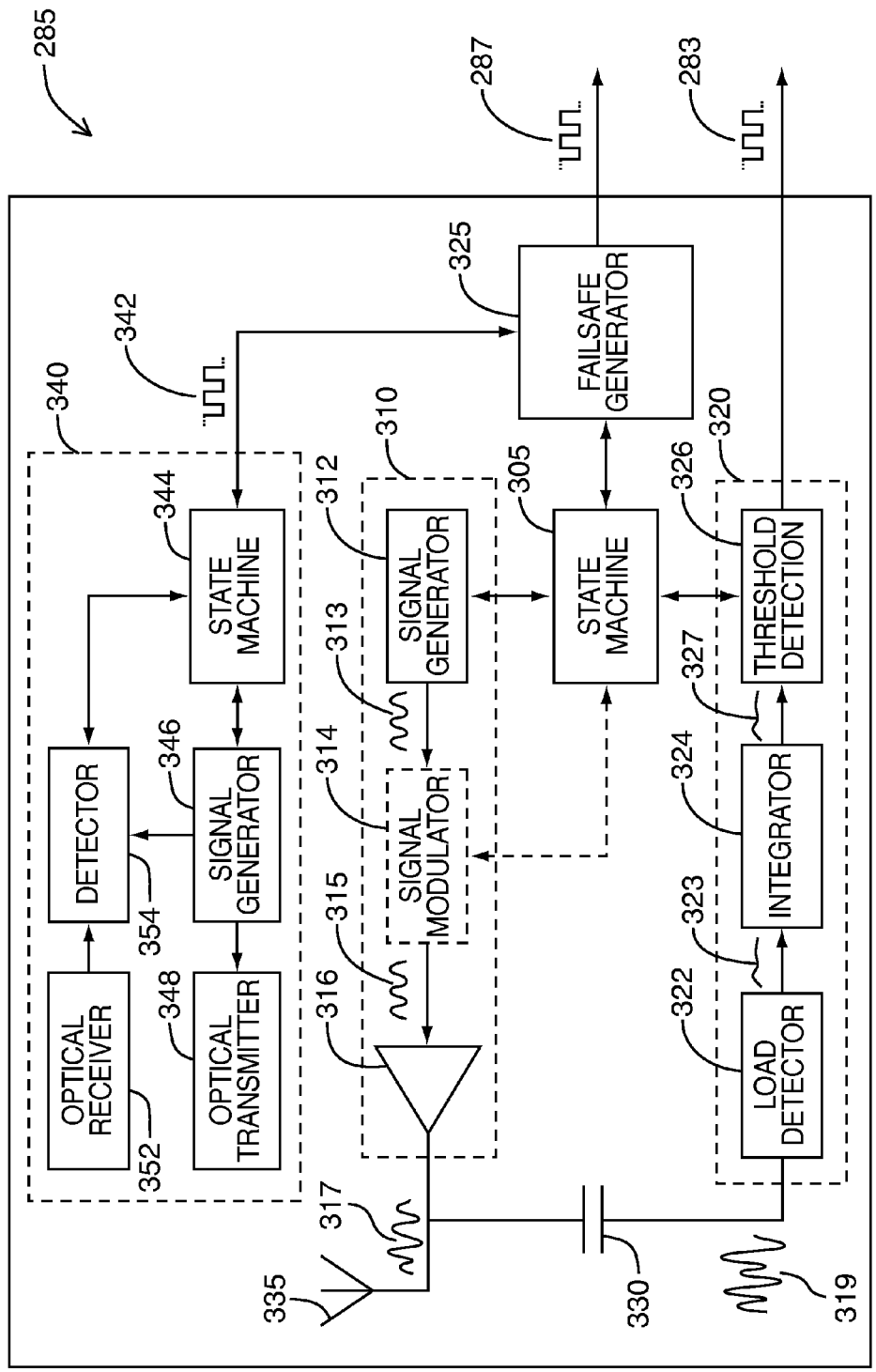
FIG. 6B is a block diagram of an alternative embodiment of the proximity sensor shown in FIGS. 5A and 5B.

Referring now to FIG. 6B, there is illustrated an alternative embodiment of the proximity sensor 285 that incorporates a supplemental sensor unit providing optical sensing to enhance failsafe detection. The proximity sensor 285 shown in FIG. 6B is similar to the example embodiment shown in FIG. 6A, but further includes an optical sensor 340 configured to estimate the distance to the user of the mobile device 100 (FIG. 1). The optical sensor can operate based on visible light, infrared light or other wavelengths or a combination thereof. The optical sensor 340 may also operate based on active (e.g., transmitting and receiving) or passive sensing (e.g., receiving only). For convenience, description of elements or components that are common to the embodiments of the proximity sensor 285 illustrated in FIGS. 6A and 6B will not be repeated; however, some differences may be highlighted or contrasted.

The optical sensor 340 is connected to the failsafe generator 325 and operates in parallel with the transmitter 310 and detection circuit 320 to generate a supplemental estimate 342 of the distance to the user of the mobile device 100. The supplemental estimate 342 is provided to the failsafe generator 325 for comparison with the distance estimate generated by the detection circuit 320 (e.g., as represented by the average detection value 327 or the sensor output signal 283). The result of the comparison may be used by the failsafe generator 325 in determining the operational status of the proximity sensor 285.

For example, the failsafe generator 325 may check for a discrepancy between the supplemental estimate 342 and the estimate generated by the detection circuit 320. If the difference between the two respective estimates exceeds a maximum prescribed difference, then the failsafe generator 325 may determine that the optical sensor 340 or, alternatively, the detection circuit 320 and/or the transmitter 310 is not functioning. In some embodiments, the supplemental estimate 342 may be a coarse estimate of user distance used only or primarily to provide verification of the sensor output signal 283. However, in alternative embodiments, the optical sensor 340 may be configured to provide a fine estimate of distance, in which case the supplemental estimate 342 may replace or be combined with the sensor output signal 283 for use in controlling the power amplification modules $290_1$ and $290_2$ (FIGS. 5A and 5B).

In one example implementation, the optical sensor 340 includes a state machine 344, a signal generator 346, an optical transmitter 348, an optical receiver 352, and a detector 354. The signal generator 346 generates a transmission signal, which is converted by the optical transmitter 348 into an optical transmission signal. For example, the optical transmitter 348 may be configured to generate infrared transmission signals specified by the signal generator 346. The optical receiver 352 receives and provides an optical detection signal to the detector 354.

Based on information about the transmission signal provided by the signal generator 346, the detector 354 is able to estimate the distance to the user. The distance to the user may be estimated based on one or more detection parameters of the optical detection signal reflected from the user. Since the optical detection signal may vary based on reflection from the user's skin, distance estimation using these methods may not be as accurate as when using other methods. However, for certain distance ranges, good accuracy may still be achieved. It is also possible to utilize passive detection where the detected level of visible or infrared light at the optical receiver 352 is compared against a known reference value. If the optical transmission signal is pulsed by the optical transmitter 348 at a specific frequency, it is possible to distinguish between the optical detection signal and noise from ambient light. Additionally, an optical detector used to turn off the display of the mobile device 100, when the mobile device 100 is close to a surface, may be utilized to also sense the distance between the user and the mobile device 100. Rather than including two separate optical detectors, use of a signal optical detector for multiple purposes may generally result in cost and/or space savings.

The signal generator 346 may forward a signal power for comparison to the received signal power of the optical detection signal. Based upon a measured power at the receiver 352, the detector 254 may then calculate power loss in the optical detection signal, which is relatable to distance through the loss coefficient of the optical detection signal propagating through air.

Figure 6C:
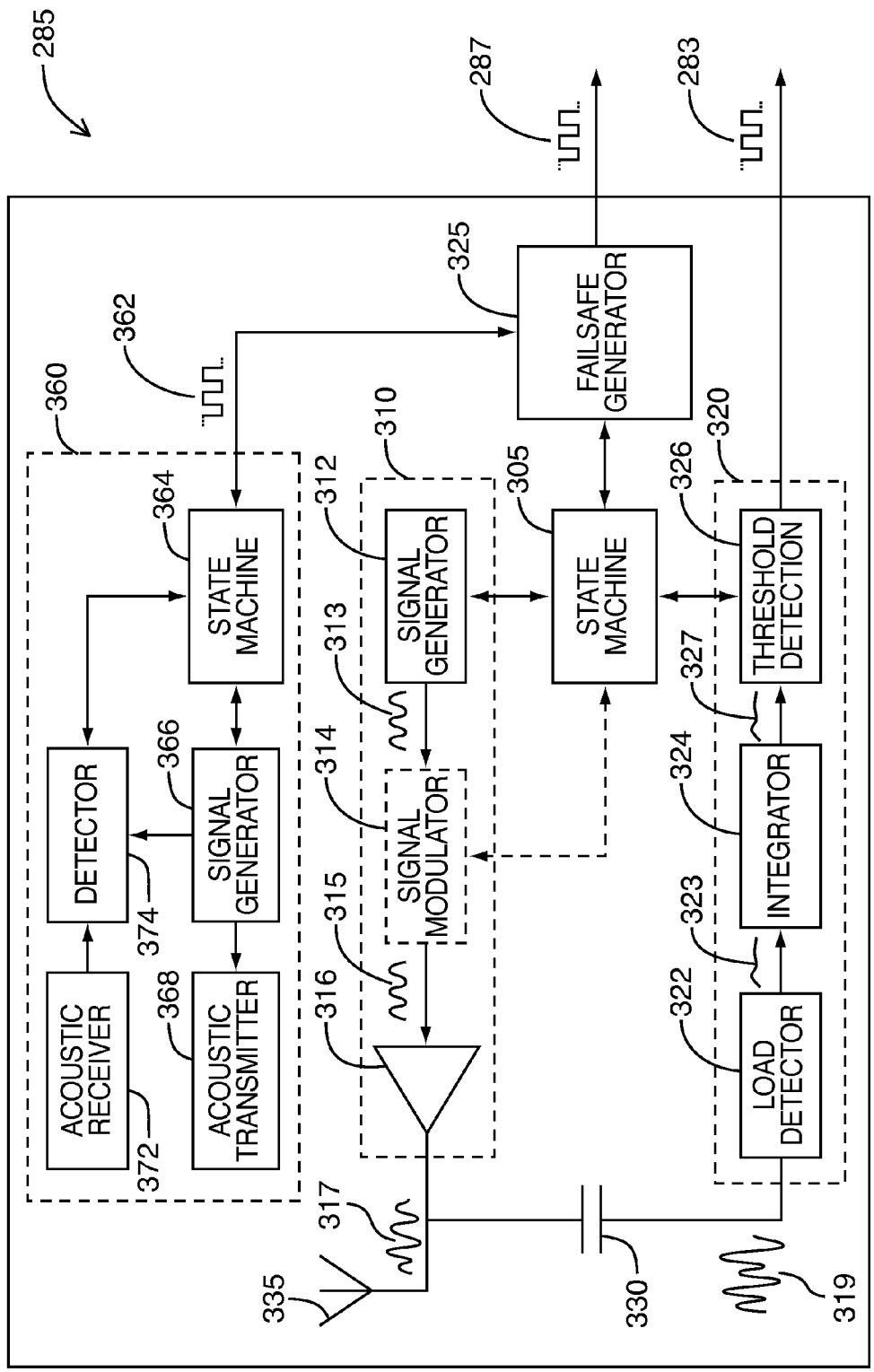
FIG. 6C is a block diagram of an alternative embodiment of the proximity sensor shown in FIGS. 5A and 5B.

Referring now to FIG. 6C, there is illustrated yet another alternative embodiment of the proximity sensor 285, which incorporates a supplemental sensor unit providing acoustic sensing to enhance failsafe detection. The proximity sensor 285 shown in FIG. 6C is similar to the example embodiment shown in FIG. 6B, except that optical sensor 340 is replaced with acoustic sensor 360 configured to generate the supplemental estimate 362 of the distance to the user of the mobile device 100 (FIG. 1). Notwithstanding the different modes of transmission for the detection signal, the embodiments shown in FIGS. 6B and 6C may function similarly.

Accordingly, in some embodiments, the acoustic sensor 360 includes a state machine 364, a signal generator 366, an acoustic transmitter 368, an acoustic receiver 372, and a detector 374. The signal generator 366 generates a transmission signal, which is converted by the acoustic transmitter 368 into an acoustic transmission signal. The acoustic receiver 372 receives and provides an acoustic detection signal to the detector 374. For example, a diaphragm, loudspeaker (such as receiver/speaker 260 in FIG. 4) or other suitable electroacoustic transducer may be used to implement the acoustic transmitter 368. A microphone, for example, may also be used to implement the acoustic receiver 372. Operation of the signal generator 366 and detector 374 may be as described above with reference to FIG. 6B and not repeated here for clarity.

In some embodiments, the acoustic receiver 372 may also be configured to perform noise cancellation by measuring the acoustic field near the acoustic transmitter 368 and, thereby, function both as a distance sensor and reference signal generator for adaptive noise cancellation. Ultrasonic frequencies may typically be used to measure the distance to the user so that the acoustic transmission and detection signals will be inaudible. In some embodiments, more than one acoustic detection signal, or alternatively an acoustic detection signal with some modulation, may be used to guard against phase cancellation of the acoustic transmission signal due to reflections from uneven surfaces. The nominal distance to the user may be estimated from either the absolute phase or the amplitude of the received acoustic detection signal.

Although not explicitly illustrated, in some embodiments, the proximity sensor 285 may include each of the optical sensor 340 and the acoustic sensor 360 to provide further enhanced failsafe detection. In some alternative embodiments, still other types of supplemental sensor units (e.g., a temperature sensor) may also be included in the proximity sensor 285 to provide still further enhanced failsafe detection. For example, a camera module integrated into the mobile device 100 for image capture or video conferencing functions may also be used with an image sensor processor to provide an estimate of the distance to the user. Providing multiple independent estimates of the distance to the user may allow for more reliable identification of a non-functioning component in the proximity sensor 285 by isolating a particular estimate that is out of line with other estimates. The number and type of supplemental sensor units, of which the optical sensor 340 and the acoustic sensor 360 provide two example configurations, is not generally limited.

Figure 7:
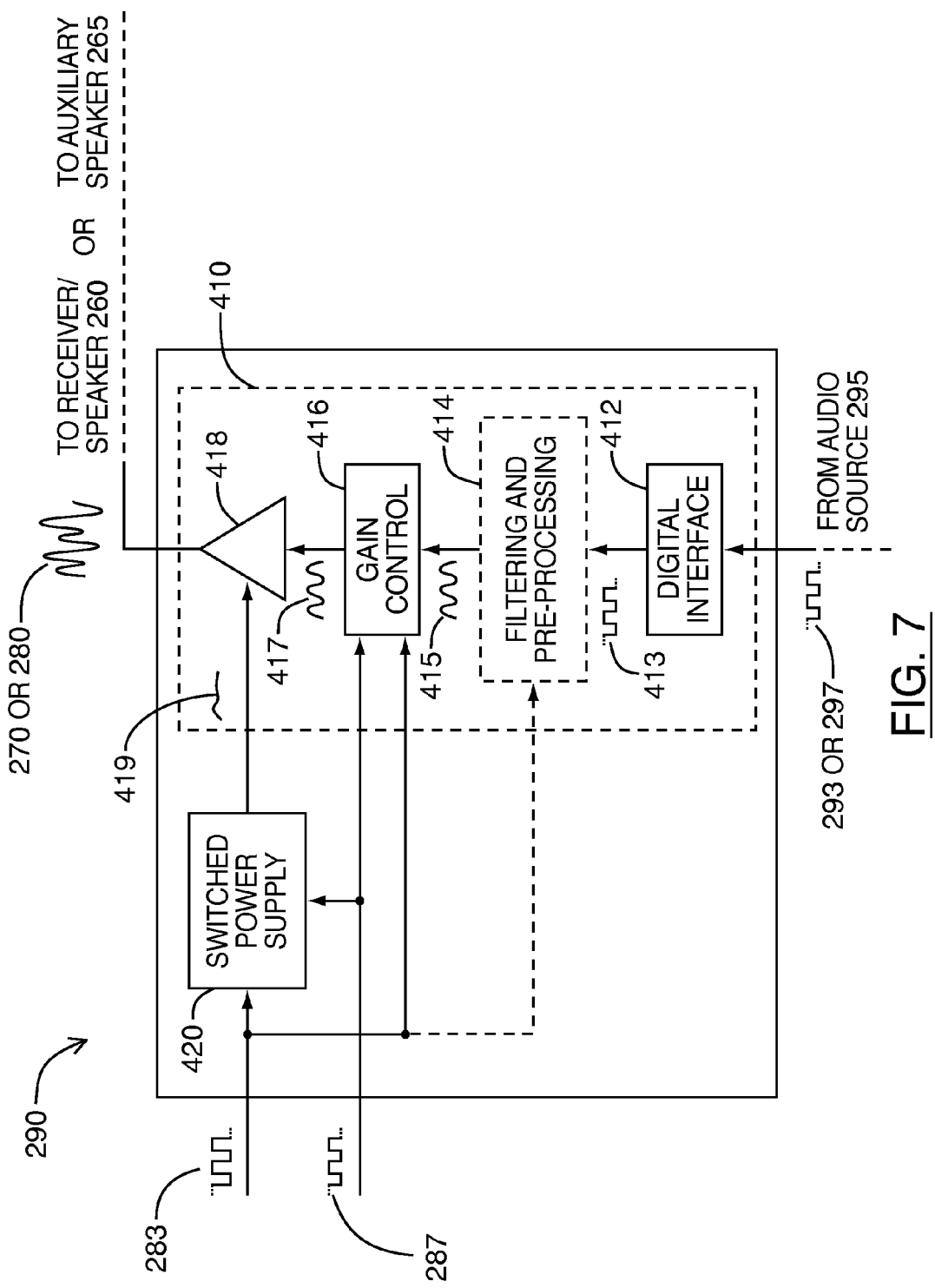
FIG. 7 is a block diagram of an embodiment of the power amplification module shown in FIGS. 5A and 5B.

Referring now to FIG. 7, there is illustrated an example implementation of a power amplification module that is controllable by the proximity sensor 285 shown in FIGS. 6A-6C. The example embodiment of the power amplification module illustrated in FIG. 7 may refer equivalently to the power amplification module $290_1$ or (in the case of the FIG. 5B embodiment) the power amplification module $290_2$. Where applicable, subscripts have been omitted from the reference numerals to generalize the embodiments.

As illustrated in FIG. 7, the power amplification module 290 includes an audio processing path 410 and a switched power supply 420. In some embodiments, the switched power supply 420 may be replaced with a battery (e.g., 130 in FIG. 1) or some other power supply source. The audio processing path 410 includes various components for processing an audio signal 293 or 297, which originates from the audio source 295, to be outputted by either the receiver/speaker 260 or the auxiliary speaker 265. The switched power supply 420 is controllable based on the sensor output signal 283 and the sensor status signal 287 to supply a variable voltage to one or more components in the processing path 410. The sensor output signal 283 and the sensor status signal 287 also serve as control signals for various components in the processing path 410.

In some embodiments, the processing path 410 includes a digital interface 412, optional filtering and pre-processing block 414, a gain controller 416, and a power amplifier 418. The digital interface 412 receives and decodes the audio signal 293 or 297, which is typically digitally encoded by the audio source 295, using a suitable codec to generate a decoded audio signal 413. The particular codec used to decode the audio signal 293 or 297 may generally depend on how the audio signal 293 or 297 was originally encoded. For example, the audio signal 293 or 297 may be encoded using the I²S standard, although other encoding schemes are possible as well, e.g., bitstream format. The digital interface 412 may also include a DAC (not shown) for converting the audio signal 293 or 297 to an analog representation, although the DAC may be included at other points in the processing path 410 instead. In some embodiments, the audio signal 293 or 297 may be any analog signal, in which case the digital interface 412 may be omitted from the processing path 410.

The decoded audio signal 413 is received into the optional filtering and pre-processing block 414 or, alternatively, is provided directly to the input of the gain controller 416. The filtering and pre-processing block 414 is responsive to the sensor output signal 283 and configured to generate a pre-processed audio signal 415 by operating on the decoded audio signal 413 according to the estimated distance to the user of the mobile device 100. If the optional filtering and pre-processing block 414 is included, the pre-processed audio signal 415 and not the decoded audio signal 413 is provided to the input of the gain controller 416.

In some embodiments, the filtering and pre-processing block 414 may interpolate and/or equalize or otherwise shape the decoded audio signal 413 for optimized playback at the estimated distance to the user. The filtering and pre-processing block 414 may similarly apply various tuning parameters for the receiver/speaker 260 or the auxiliary speaker 265 that vary based on the distance to the user to optimize playback of the amplified audio signal 270 or the amplified auxiliary audio signal 280, respectively. For example, the filtering and pre-processing block 414 may include one or more filters, such as bi-quad filters, having filter coefficients that are controllable or adjustable based on the value of the sensor output signal 283 to optimize the pre-processed audio signal 415 based on the distance to the user. The filtering and pre-processing block 414 may also include one or more circuits configured to softly change between two or more sets of filter coefficients. In some embodiments, the filtering and pre-processing block 414 may also provide a slow adaptation between two or more gain steps of the gain controller 416 in order to avoid audible clicks when transitioning between steps.

In some embodiments, a microphone (not shown) may also be placed near the receiver/speaker 260 or auxiliary speaker 265. A microphone signal generated by the microphone may be compared to the audio output from the receiver/speaker 260 or auxiliary speaker 265 and, by determining a transfer function between these two signals, an estimate of the acoustic leak may be possible. For example, the acoustic leak may be used to represent the acoustic environment near to the receiver/speaker 260 or auxiliary speaker 265. Based on the acoustic leak, an estimate of distance to the user may be made. Based on the acoustic leak and the estimated distance, a correction for the transfer function can be made in the filtering and pre-processing block 414 to increase the fidelity of the audio output from the receiver/speaker 260 or auxiliary speaker 265. An adaptive process may also be used to monitor the transfer function between the acoustic output from the receiver/speaker 260 to the microphone.

For example, when the mobile device 100 is located in very close proximity to the user's ear, low frequency sound signals emitted from the mobile device 100 may be attenuated less as compared to emission in free air. Accordingly, by determining the acoustic environment of the receiver/speaker 260 or the auxiliary speaker 265, variations in sound emission due to the specific acoustic environment may be corrected in the filtering and pre-processing block 414 of the power amplification module 290. As another example, the microphone may also be used to detect and reduce ambient noise in the vicinity of the receiver/speaker 260 or auxiliary speaker 265, while also providing an estimation of proximity to the user.

The gain controller 416 generates a gain-controlled audio signal 417 by applying a gain factor to the pre-processed audio signal 415 or, in some cases, the decoded audio signal 413. The gain factor applied by the gain controller 416 may be fixed or variable based on the distance to the user and the operational status of the proximity sensor 285, and is used by the gain controller 416 to control volume output from the receiver/speaker 260 or auxiliary speaker 265. Accordingly, the gain controller 416 may generally apply larger gain factors in order to increase volume output and smaller gain factors to decrease volume output, but subject to continued operation of the proximity sensor 285. The nominal gain factor applied by the gain controller 416 may be controlled by the control values encoded into the sensor output signal 283 and the sensor status signal 287, which are provided to the gain controller 416 and to which the gain controller 416 is responsive. The range of gain factors applied by the gain controller 416 may be determined in relation to a reference amplitude of the audio signal 293 or 297 and different parameters of the receiver/speaker 260 or auxiliary speaker 265.

In some embodiments, the proximity sensor 285 may be enabled only when the selected gain by an external controller (not shown) is relatively high. In this case, the additional power consumption of the proximity sensor 285 required to determine the distance to the user is only incurred when the acoustic output of the receiver/speaker 260 or the auxiliary speaker 265 is relatively high. In some embodiments, the amplitude of the audio signal 293 or 297 is monitored to provide an indication of acoustic output, and the proximity sensor 285 is enabled only for relatively large amplitudes of the audio signal 293 or 297.

In some embodiments, the gain controller 416 applies a variable gain factor based on the estimated distance to the user. However, the applied gain factor may be subject to override if the sensor status signal 287 is encoded with the OVERRIDE control value to indicate that the proximity sensor 285 (FIGS. 6A-6C) has been interrupted or is otherwise unresponsive or not operational, in which case a fixed or limited gain factor that is independent of the distance to the user may be applied instead. However, in some cases, a fixed or limited gain factor may also be applied in response to the DEFAULT control value. Some example gain control methods performed by the gain controller 416 will now be explained, first for situations in which the proximity sensor 285 is functioning.

In embodiments where the sensor output signal 283 encodes an estimate of the nominal distance to the user, the gain controller 416 may control the applied gain factor as a continuous or discrete function of the distance to the user. For example, the gain controller 416 may determine and apply a gain factor that varies proportionate to the estimated nominal distance to the user, so that larger gain factors are applied as the user moves further away from the mobile device 100. However, as will be appreciated, other general relations between the distance to the user and the applied gain factor may also be utilized. For example, a non-linear relationship between the applied gain factor and the distance to the user may be used. If a reference microphone is used to monitor the acoustic environment close to the receiver/speaker 260 or auxiliary speaker 265, it is also possible to correct for the changing transfer function to the user's ear as a function of the estimated distance to the user.

Alternatively, the gain controller 416 may apply one of a discrete number of different gain settings in response to the control value encoded into the sensor output signal 283. Each gain setting used by the gain controller 416 may be pre-determined for a different distance estimate or distance range to the user. Without limitation, the gain controller 416 may have defined a high gain setting for when the user is relatively far away from the mobile device 100, and a low gain setting for when the user is in relatively close proximity. In some embodiments, three or more discrete gain settings may be pre-determined for the gain controller 416. In some embodiments, the gain controller 416 may also apply different gain factors depending on the output volume of the receiver/speaker 260 or auxiliary speaker 265. A generally unlimited number of different gain settings may be possible.

The sensor output signal 283 may be encoded by the proximity sensor 285 with a control value corresponding to one of the gain settings of the gain controller 416. For example, the distance ranges defined for the threshold comparator 326 (FIGS. 6A-6C) may correspond one-to-one with the different gain settings of the gain controller 416. In these cases, the control value encoded into the sensor output signal 283 by the threshold comparator 326 may act as an index into a lookup table storing the different gain settings for the gain controller. In some embodiments, one or more intermediate gain values may be used during transitions from one gain value to the other gain values in response to the control values encoded into the sensor output signal 283 and sensor status signal 287. In some embodiments, the gain controller 416 may also be programmed by a baseband controller (not shown). In this case, the total gain applied to the audio signal 293 or 297 may be determined by the baseband controller and the control values encoded into the sensor output signal 283 and sensor status signal 287.

In some embodiments, when the sensor output signal 283 is encoded with a control value to represent the estimate of the nominal distance to the user, the gain controller 416 may apply logic or other processing to the sensor output signal 283 to select one of the pre-determined gain settings. Even if the gain controller 416 implements discrete gain settings, it may still be convenient to encode the precise distance to the user in the sensor output signal 283. For example, in embodiments of the proximity sensor 285 that include supplemental sensors (e.g., FIGS. 6B and 6C), encoding the nominal distance to the user in the sensor output signal 283, as opposed to a distance range, may facilitate comparison with the supplemental estimates of distance (i.e., 344 and 364) to determine the operational status of the proximity sensor 285.

The applied gain factor may also depend on the volume output from the receiver/speaker 260 or auxiliary speaker 265. For example, when the sensor status signal 283 is encoded with the DEFAULT control value, the gain controller 416 may select a different gain factor based on the volume output from the receiver/speaker 260 or auxiliary speaker 265 in relation to a maximum prescribed volume. If the output volume is below the maximum prescribed volume, the gain controller 416 may apply a different gain fact then when the output volume is above the maximum prescribed volume. In this way, the gain controller 416 may only actively regulate the output volume from the receiver/speaker 260 or auxiliary speaker 265 for sound levels that may be excessive to the user.

The gain controller 416 may also determine the gain factor applied to the pre-processed audio signal 415 (or decoded audio signal 413) based on the operational status of the proximity sensor 285. For example, should the sensor output signal 287 indicate that the proximity sensor 285 has ceased functioning using the OVERRIDE control value, the gain controller 416 may respond by limiting the gain applied to the pre-processed audio signal 415 (or decoded audio signal 413). Because the estimated distance to the user may no longer be reliable, in some embodiments, the gain controller 416 overrides the sensor output signal 283 and applies a fixed gain factor that would be appropriate for situations where the user is in close proximity to the mobile device 100. For example, the gain controller 416 may apply the gain factor associated with the above-described low gain setting. The gain controller 416 may remain in the fixed gain setting so long as the proximity sensor 285 is not operational.

The power amplifier 418 amplifies the gain-controlled audio signal 417 into the amplified audio signal 270 or (in the case of the FIG. 5B embodiment) the amplified auxiliary audio signal 280. In some embodiments, different gain settings for the power amplifier 418 may also be defined and implemented efficiently by simultaneously controlling the magnitude of a voltage supply signal 419 generated by the switched power supply 420 and provided to the power amplifier 418. For example, the gain settings for the power amplifier 418 may correspond to the discrete gain settings predetermined for the gain controller 416, and may be selected based on the control values encoded into the sensor output signal 283 and the sensor status signal 287.

Again, without limitation, the power amplifier 418 may have defined at least a high gain setting, for when the user is relatively far away from the mobile device 100, and a low gain setting for when the user is in relatively close proximity. For example, the amplitude of the supply voltage signal 419 corresponding to the high gain setting may be anywhere from about 2 to 5 times larger than that for the low voltage setting. In some embodiments, a reduction in voltage supply for the power amplifier 418 is used in combination with a reduction in gain applied by the gain controller 416. Moreover, in some embodiments, three or more discrete voltage settings may be pre-determined for the power amplifier 418. A generally unlimited number of different voltage settings may again be possible and, in some embodiments, may be implemented using a feedback loop and the switched power supply 420.

In some embodiments, the power amplifier 418 may be implemented as a combination of amplifiers from different classes of amplifiers that operate efficiently in different output power ranges. Based on the selected setting for the power amplifier 418, an appropriate class of amplifier may be enabled within the power amplifier 418 to optimize the output of the power amplifier 418 for playback in the receiver/speaker 260. For example, the power amplifier 418 may be implemented with at least a combination of a switching class-D and a class AB or class G amplifier. The switching class-D amplifier may be optimized for high volume output from the receiver/speaker 260 (i.e., loudspeaker mode), while the class AB or class G amplifier may be optimized for low noise output from the receiver/speaker 260, as may be suitable for a receiver mode (i.e., voice communications) with very low noise floor. In some embodiments, the switched power supply 420 is synchronized to the switching class-D amplifier within the power amplifier 418 in order to decrease distortion and noise. By controlling the level of the supply voltage signal 419 in relation to the volume output from the receiver/speaker 260, the switching class-D amplifier may have increased output power at stepped up voltage levels. However, a lower level of the supply voltage signal 419 may also allow for lower power output levels with decreased losses and noise.

To vary the level of the voltage supply signal 419 provided to the power amplifier 418, the switched power supply 420 may include one or more different voltage converters. In some embodiments, a different type or class of converter may be enabled for each gain setting of the power amplifier 418. For example, the switched power supply 420 may comprise a step-down (buck) converter enabled for the low gain setting of the power amplifier 418 and a step-up (boost) converter enabled for the high gain setting. Alternatively, the switched power supply 420 may comprise a single step-down/step-up (buck-boost) converter for generating the voltage supply signal 419. In such embodiments, the switched power supply 420 may operate in a boost mode for high gain setting and a buck mode for the low gain setting. Accordingly, in some embodiments, use of a switching amplifier capable of stepping voltage both up or down may enable higher output levels and/or lower noise for lower audio output levels, while also maintaining good efficiency.

In some embodiments, the receiver/speaker 260 may also have a variable load so that the sensitivity and impedance of the receiver/speaker 260 varies with the gain setting of the power amplifier 418. For example, the receiver/speaker 260 may include multiple internal coils and a switch network (not shown) in order to vary the coupling between the power amplifier 418 and the internal coils of the receiver/speaker 260. Varying the impedance of the receiver/speaker 260 corresponding to the gain setting of the power amplifier 418 can reduce the differences between the various gain settings, thereby making the power amplifier 418 easier to implement and more power efficient.

To illustrate how the impedance of the receiver/speaker 260 may be varied, two internal 16Ω coils that are switchable between series and parallel connections may be included. For the high gain setting, the two internal coils may be parallel-connected to form an equivalent 8Ω coil. Similarly for the low gain setting, the two internal coils may be series-connected to form an equivalent 32Ω coil. In still other embodiments, for an intermediate gain setting, only one of the 16Ω coils may be coupled to the power amplifier 418 leaving the other of the 16Ω coils floating. Additional coils may also be added to realize further gain settings. This may enable more efficient power amplification and a lower noise floor to be obtained in various modes of operation.

As described above for the gain controller 416, the power amplifier 418 may be controlled based on the sensor output signal 283, but subject to override in response to the sensor status signal 287 indicating that the proximity sensor 285 is not operational. In such cases, the control values encoded in the sensor output signal 283 may be overridden and the power amplifier 418 operated in the low gain setting, as described above.

Figure 8:
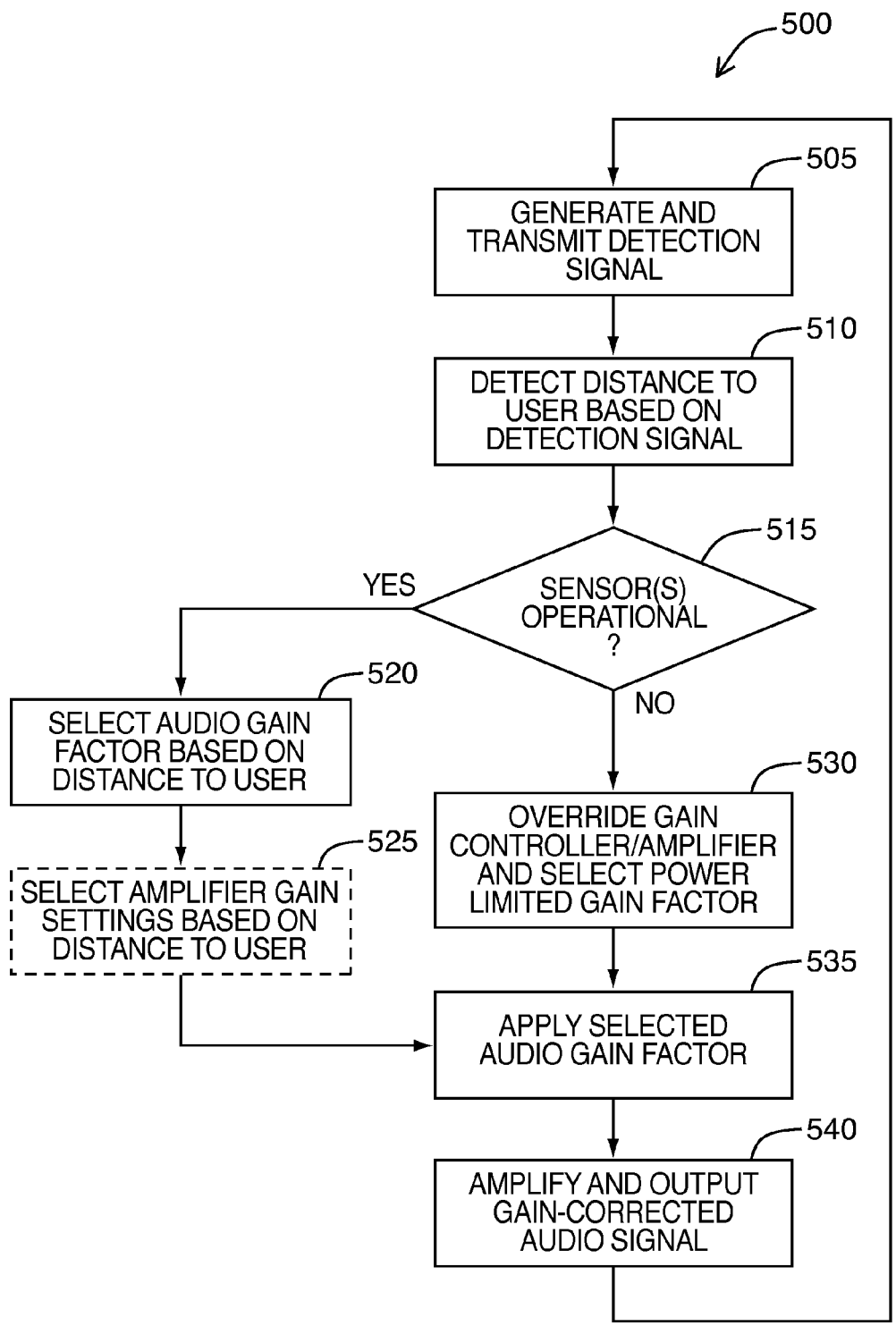
FIG. 8 is a flow diagram of a method of operating a mobile device.

Referring now to FIG. 8, there is illustrated a method for controlling volume output in at least one speaker of a mobile device. The method 500 may be performed by various components of the audio subsystem 250 shown in FIGS. 5A and 5B, such as the proximity sensor 285, the power amplification modules 290₁ and/or 290₂, the receiver/speaker 260 and, in at least some cases, the auxiliary speaker 265. Accordingly, the following description of method 500 may be abbreviated for clarity. Further details of the method 500 are provided above with reference to FIGS. 4-7.

At 505, a detection signal is generated and transmitted for estimating distance between a device, such as the mobile device 100 (FIG. 1), and a user. The detection signal may be a frequency signal suitable for a capacitive sensing scheme, but alternatively may be an optical signal, an infrared signal, an acoustic signal, a temperature signal, an image signal or any other suitable signal. In some embodiments, the audio output from the mobile device or other external physical parameters may be utilized to estimate the distance to the user as an alternative to a dedicated detection signal.

At 510, the detection signal is received and processed by a proximity sensor (e.g., 285), for example, included in the mobile device in order to estimate the distance to the user. In some embodiments, the distance may be represented as a continuous or discrete estimate. Alternatively, the distance to the user may estimated by determining one of a plurality of different distance ranges.

At 515, the operational status of the proximity sensor is determined. In some embodiments, it is determined whether the proximity sensor is operating as expected or if the proximity sensor has become unresponsive or is otherwise experiencing interrupted operation or not functioning. To detect the operational status of the proximity sensor, one or more operating or detection parameters of various internal or external signals of the proximity sensor may be monitored for an indication of the inoperability of the proximity sensor. Examples of some signals that may be monitored for this purpose are described above.

If it is determined that the proximity sensor is functioning, the method 500 branches to 520, where a gain controller selects a variable gain factor for an audio signal based on the estimated distance to the user. For example, the gain factor may be determined as a continuous or discrete function of the distance to the user. Alternatively, the gain factor may be selected from one of a plurality of discrete gain factors corresponding to difference distance ranges of the user. In some embodiments, the gain factor is selected between a low gain setting (e.g. for where the user is in relatively close proximity to the mobile device) and a high gain setting (e.g. for when the user is relatively far away from the mobile device). In some embodiments, the gain factor may be controlled based on the estimated distance to the user and the operability of the proximity sensor only during high volume audio playback. For low volume audio playback, the gain factor may be fixed and determined independently of the estimated distance to the user and the operability of the proximity sensor, for example, by a baseband audio controller.

Optionally, at 525, a gain setting for a power amplifier is also selected based on the distance to the user. For example, a voltage supply for the power amplifier may be varied between a high and low voltage level, or some other number of levels, based on the distance to the user. Similar to the audio gain factor, the voltage supply may also be varied as a continuous or discrete function of the estimated distance to the user. A switched power supply may be used to vary the voltage supply for the power amplifier. In some embodiments, the level of the voltage supply may only depend on the estimated distance to the user and the operability of the proximity sensor during high volume audio playback and not at other times. In addition to changing the operating voltage of the power amplifier, in some embodiments, the power amplifier gain may also be varied.

In some embodiments, at 525, a class of power amplifier may also be selected based on the distance to the user. As one example, a switching class-D amplifier optimized for high volume output may be selected for the power amplifier high gain setting, while a class AB amplifier or class G amplifier optimized for low noise output may be selected for the power amplifier low gain setting.

If it is determined at 515 that the proximity sensor has become unresponsive or is otherwise not operational, the method 500 branches to 530 where the gain controller and power amplifier are overridden and a fixed or limited gain setting may be selected regardless of the detected distance of the user.

At 535, the selected audio gain factor is applied to the audio signal to generate a gain-controlled audio signal and, at 540, the gain-controlled audio signal is amplified in the power amplifier and output by one or more speakers. The method 500 may then return to 505 to generate and transmit a new detection signal, thereby providing continuous or intermittent feedback control of the power amplification module based on the output of the proximity sensor.

Implementation of one or more embodiments may realize one or more benefits, some of which have been indicated already. One or more embodiments may improve the efficiency with which a mobile device may meet various regulations or standards for audio output, and may promote improvements in safety while maintaining utility of the mobile device. When implemented in the context of a handheld device such as cellular telephone, the concepts described above can be advantageously realized with hardware components that are small and lightweight, as size and weight may be design considerations of special concern for handheld devices. Moreover, the concepts described herein may be flexibly applied to a wide range of mobile devices and configurations of mobile devices (such as "flip-phone," tablet computer, etc.).

In addition, some of the described embodiments also provide improvements in power regulation and consumption within battery-powered devices, which may also be a design consideration of special concern in these devices to improve battery life. Various aspects of the described embodiments also provide multiple or redundant uses of different mobile device components, which advantageously tends to reduce size and weight of the mobile device. Other aspects of the described embodiments also add robustness and reliability to the different mobile device functions, which may tend to increase user experience. Different embodiments described herein may, though not necessarily, realize one or more of these different benefits as well as other benefits not specifically noted.

While the above description provides examples of the embodiments, it will be appreciated that some features and/or functions of the described embodiments are susceptible to modification without departing from the spirit and principles of operation of the described embodiments. Accordingly, what has been described above has been intended to be illustrative only and non-limiting.

The invention claimed is:

1. An audio subsystem for a mobile device comprising at least one speaker, the audio subsystem comprising:
   an audio source for generating an audio signal;
   a proximity sensor comprising a detection circuit configured to generate a sensor output signal representing a distance to a user of the mobile device, and a failsafe generator coupled to the detection circuit and configured to generate a sensor status signal indicating an operational status of the proximity sensor; and
   a power amplification module configured to process the audio signal received from the audio source into an amplified audio signal for output by the at least one speaker, the power amplification module comprising a gain controller responsive to the sensor output signal and the sensor status signal to determine and apply a gain factor to the audio signal based on the distance to the user of the mobile device and the operational status of the proximity sensor;
   wherein the failsafe generator is configured to
      monitor an operating parameter of at least one internal signal of the proximity sensor, the operating parameter of the at least one internal signal indicative of the operational status of the proximity sensor;
      generate the sensor status signal based on the operating parameter of the at least one internal signal;
      monitor the operating parameter of the at least one internal signal over a time interval;
      if over the time interval the operating parameter of the at least one internal signal is within an expected range, set the sensor status signal to a default control value for the gain controller to apply variable gain to the audio signal based on the distance to the user; and
      if over the time interval the operating parameter of the at least one internal signal is outside the expected range, set the sensor status signal to an override control value for the gain controller to apply fixed gain to the audio signal independently of the distance to the user.

2. The audio subsystem of claim 1, wherein the proximity sensor further comprises
   a transmitter for generating a transmission signal;
   a transmitting antenna coupled to the transmitter for radiating the transmission signal outwardly from the mobile device; and
   a receiving antenna for generating a proximity detection signal having a detection parameter that varies in relation to the transmission signal based on the distance to the user; and
wherein the detection circuit is coupled to the receiving antenna to receive the proximity detection signal and configured to generate the sensor output signal based on the detection parameter of the proximity detection signal.

3. The audio subsystem of claim 2, wherein the transmitter comprises a signal generator for generating a frequency signal, and the failsafe generator is configured to generate the sensor status signal by monitoring a first operating parameter of at least one of the frequency signal and the transmission signal.

4. The audio subsystem of claim 3, wherein the transmitter further comprises a signal modulator coupled to the signal generator for modulating the frequency signal to generate a modulated frequency signal, and wherein the failsafe generator is configured to generate the sensor status signal by monitoring a second operating parameter of at least one of the modulated frequency signal and the transmission signal.

5. The audio subsystem of claim 2, wherein the detection circuit comprises a load detector for generating a load detection signal based on the proximity detection signal to represent an effective loading of the user on the transmitting antenna, and wherein the failsafe generator is configured to generate the sensor status signal based on the effective loading of the user on the transmitting antenna.

6. The audio subsystem of claim 1, wherein the failsafe generator is configured to
monitor the operating parameter of the at least one internal signal over a time interval;
if over the time interval the operating parameter of the at least one internal signal is within an expected range, set the sensor status signal to a default control value for the gain controller to: (i) apply a first fixed gain to the audio signal, if an output volume of the at least one speaker is less than a maximum volume determined for the distance to the user, and (ii) apply a second fixed gain less than the first fixed gain to the audio signal, if the output volume of the at least one speaker is above the maximum volume determined for the distance to the user; and
if over the time interval the operating parameter of the at least one internal signal is outside the expected range, set the sensor status signal to an override control value for the gain controller to apply a third fixed gain to the audio signal independently of the distance to the user.

7. The audio subsystem of claim 1, further comprising at least one supplemental sensor unit for generating at least one supplemental estimate of the distance to the user, and wherein the failsafe generator is configured to determine the sensor status signal based on the sensor output signal and the at least one supplemental estimate of the distance to the user, and generate the sensor output signal based on a difference between the sensor output signal and the at least one supplemental estimate of the distance to the user;
wherein if the difference between the sensor output signal and the at least one supplemental estimate of the distance to the user exceeds a maximum difference, the failsafe generator is configured to set the sensor status signal to an override control value for the gain controller to apply fixed gain to the audio signal independently of the distance to the user.

8. An audio subsystem for a mobile device comprising at least one speaker, the audio subsystem comprising:
an audio source for generating an audio signal;
a proximity sensor comprising a detection circuit configured to generate a sensor output signal representing a distance to a user of the mobile device, and a failsafe generator coupled to the detection circuit and configured to generate a sensor status signal indicating an operational status of the proximity sensor;
a power amplification module configured to process the audio signal received from the audio source into an amplified audio signal for output by the at least one speaker, the power amplification module comprising a gain controller responsive to the sensor output signal and the sensor status signal to determine and apply a gain factor to the audio signal based on the distance to the user of the mobile device and the operational status of the proximity sensor;
wherein the failsafe generator is configured to
monitor an operating parameter of at least one internal signal of the proximity sensor, the operating parameter of the at least one internal signal indicative of the operational status of the proximity sensor; and
generate the sensor status signal based on the operating parameter of the at least one internal signal; and
wherein the proximity sensor comprises an isolation switch for enabling and disabling the proximity sensor based upon an output volume of the at least one speaker in relation to a maximum volume.

9. A method for controlling volume output in at least one speaker of a mobile device, the method comprising:
a proximity sensor detecting a distance to a user of the mobile device;
monitoring an operational status of the proximity sensor;
providing an audio signal from an audio source;
a) processing the audio signal into an amplified audio signal by determining and applying a gain factor to the audio signal based on the distance to the user of the mobile device and the operational status of the proximity sensor;
b) providing the amplified audio signal to the at least one speaker for output by the at least one speaker;
monitoring an operating parameter of at least one internal signal of the proximity sensor, the operating parameter of the at least one internal signal indicative of the operational status of the proximity sensor;
determining the operational status of the proximity sensor based on the operating parameter of the at least one internal signal; and,
monitoring the operating parameter of the at least one internal signal over a time interval;
if over the time interval the operating parameter of the at least one internal signal is within an expected range, applying variable gain to the audio signal based on the distance to the user; and
if over the time interval the operating parameter of the at least one internal signal is outside the expected range, applying fixed gain to the audio signal independently of the distance to the user.

10. The method of claim 9, further comprising the proximity sensor:
generating a transmission signal;
radiating the transmission signal outwardly from the mobile device; and
generating a proximity detection signal having a detection parameter that varies in relation to the transmission signal based on the distance to the user, and wherein the method further comprises detecting the distance to the user based on the detection parameter of the proximity detection signal.

11. The method of claim 10, wherein the generating the transmission signal comprises generating a frequency signal, and the method further comprises:
monitoring a first operating parameter of at least one of the frequency signal and the transmission signal; and
determining the operational status of the proximity sensor based on the first operating parameter.

12. The method of claim 11, wherein the generating the transmission signal further comprises modulating the frequency signal to generate a modulated frequency signal, and the method further comprises:
monitoring a second operating parameter of at least one of the modulated frequency signal and the transmission signal; and
determining the operational status of the proximity sensor based on the second operating parameter.

13. The method of claim 10, further comprising:
generating a load detection signal based on the proximity detection signal to represent an effective loading of the user on a transmitting antenna of the proximity sensor; and
determining the operational status of the proximity sensor based on the effective loading of the user on the transmitting antenna.

14. The method of claim 9, further comprising:

monitoring the operating parameter of the at least one internal signal over a time interval;

if over the time interval the operating parameter of the at least one internal signal is within an expected range: (i) applying a first fixed gain to the audio signal, if an output volume of the at least one speaker is less than a maximum volume determined for the distance to the user, and (ii) applying a second fixed gain less than the first fixed gain to the audio signal, if the output volume of the at least one speaker is above the maximum volume determined for the distance to the user; and if over the time interval the operating parameter of the at least one internal signal is outside the expected range, applying a third fixed gain to the audio signal independently of the distance to the user.

15. The method of claim 9, further comprising:

generating at least one supplemental estimate of the distance to the user;

determining the operational status of the proximity sensor based on the distance to the user detected by the proximity sensor and the at least one supplemental estimate of the distance to the user;

determining the operational status of the proximity sensor based on a difference between the distance to the user detected by the proximity sensor and the at least one supplemental estimate of the distance to the user; and, if the difference between the distance to the user detected by the proximity sensor and the at least one supplemental estimate of the distance to the user exceeds a maximum difference, applying fixed gain to the audio signal independently of the distance to the user.

16. The method of claim 9, further comprising:

determining if an output volume of the at least one speaker exceeds a maximum volume;

enabling the proximity sensor when it is determined that the output volume exceeds the maximum volume; and disabling the proximity sensor when it is determined that the output volume does not exceed the maximum volume.

* * * * *